United States Patent
Tsubata

(10) Patent No.: US 10,128,342 B2
(45) Date of Patent: Nov. 13, 2018

(54) SEMICONDUCTOR DEVICE AND METHOD FOR MANUFACTURING THE SAME

(71) Applicant: Renesas Electronics Corporation, Koutou-ku, Tokyo (JP)

(72) Inventor: Kyoichi Tsubata, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/790,031

(22) Filed: Oct. 22, 2017

(65) Prior Publication Data

US 2018/0182855 A1 Jun. 28, 2018

(30) Foreign Application Priority Data

Dec. 26, 2016 (JP) .................................. 2016-250698

(51) Int. Cl.
| | |
|---|---|
| *H01L 29/417* | (2006.01) |
| *H01L 29/78* | (2006.01) |
| *H01L 29/41* | (2006.01) |
| *H01L 29/66* | (2006.01) |
| *H01L 29/06* | (2006.01) |

(52) U.S. Cl.
CPC .... *H01L 29/41725* (2013.01); *H01L 29/0607* (2013.01); *H01L 29/41* (2013.01); *H01L 29/66477* (2013.01); *H01L 29/78* (2013.01)

(58) Field of Classification Search
CPC .................................................. H01L 29/0847
See application file for complete search history.

(56) References Cited

U.S. PATENT DOCUMENTS

| | | | |
|---|---|---|---|
| 5,859,452 A | 1/1999 | Jo et al. | |
| 2001/0038133 A1* | 11/2001 | Song ..................... | G11C 11/412 257/393 |
| 2006/0148158 A1 | 7/2006 | Cho et al. | |

(Continued)

FOREIGN PATENT DOCUMENTS

JP 2006-058413 A 3/2006

OTHER PUBLICATIONS

Extended European Search Report dated Apr. 30, 2018, in European Patent Application No. EP17201233.8.

*Primary Examiner* — Thao P Le
(74) *Attorney, Agent, or Firm* — Shapiro, Gabor and Rosenberger, PLLC

(57) ABSTRACT

Characteristics of a semiconductor device are improved. An active region including a MOS transistor is structured such that the active region includes, in a plan view, a first side extending in X direction, a second side opposing the first side, an extension part projecting from the first side, and a cut-away portion recessed from the second side. By forming the cut-away portion on the second side opposing the first side where the extension part is formed, the active-region area increase caused by a first rounded portion can be cancelled by the active-region area decrease caused by a second rounded portion. Therefore, even when a gate electrode is disposed near the extension part, gate width variation can be inhibited and characteristics of the MOS transistor can be improved. The distance between the extension part and the gate electrode can be reduced to facilitate miniaturization of the MOS transistor.

20 Claims, 19 Drawing Sheets

(56) References Cited

U.S. PATENT DOCUMENTS

| | | | |
|---|---|---|---|
| 2007/0034965 A1* | 2/2007 | Jung | ................. H01L 27/14603 257/369 |
| 2008/0197419 A1* | 8/2008 | Liaw | ...................... H01L 27/11 257/368 |
| 2011/0217660 A1 | 9/2011 | Hung | |
| 2014/0048856 A1 | 2/2014 | Song et al. | |
| 2018/0061819 A1* | 3/2018 | Liaw | .................... H01L 27/088 |

* cited by examiner

SEMICONDUCTOR DEVICE AND METHOD FOR MANUFACTURING THE SAME

CROSS-REFERENCE TO RELATED APPLICATIONS

The disclosure of Japanese Patent Application No. 2016-250698 filed on Dec. 26, 2016 including the specification, drawings and abstract is incorporated herein by reference in its entirety.

BACKGROUND

The present invention relates to a semiconductor device and a manufacturing method for the same and, particularly, can be suitably applied to semiconductor devices including MOS (Metal Oxide Semiconductor) transistors.

Technology for miniaturizing MOS transistors while maintaining their characteristics is important. For example, to accurately transfer a pattern formed in a reticle (herein after referred to as a "reticle pattern") onto a film included in a semiconductor device, reticle pattern correction technology using optical simulations has been in use.

For example, in Japanese Unexamined Patent Application Publication No. 2006-58413, technology is disclosed in which a mask is formed based on an OPC-corrected pattern (corrected by optical proximity correction) and wafer processing is performed using the mask thus formed.

SUMMARY

The present inventors have been earnestly conducting studies to improve characteristics of semiconductor substrates including MOS transistors.

A MOS transistor includes an active region defined by an isolating insulation region, a gate electrode disposed over the active region via a gate insulation film, and source and drain regions formed in the semiconductor substrate to be on both sides of the gate electrode. The active region and the gate electrode included in the MOS transistor are processed into various shapes corresponding to the circuit layout for the MOS transistor. For example, an extension part to be coupled to the source and drain regions are formed in the active region and a wide part to serve as a contact area is included in the gate electrode. The extension part and the wide part include, as seen in a plan view, corners, but such corners are not formed with high accuracy as being described later and this leads to a problem of characteristics deterioration of semiconductor device elements.

There is technology such as the above-mentioned OPC correction that can improve processing accuracy, but there are limitations to the processing accuracy. Hence, studies are desired to be made on a device structure and a manufacturing method which allow, without depending on processing accuracy, a semiconductor device to maintain its characteristics.

Other objects and novel features of the present invention will become apparent from the description of this specification and the attached drawings.

Structures according to typical embodiments disclosed in this application are outlined below.

In a semiconductor device of a typical embodiment disclosed in this application, a rectangular active region or a gate electrode includes, as seen in a plan view, a projecting part (an extension part) projecting from a long side and a cut-away portion recessed from the other long side and corresponding to the projecting part.

In a semiconductor device manufacturing method of a typical embodiment disclosed in this application, a rectangular active region or a gate electrode is, in a forming process, formed to include a projecting part projecting from a long side and a cut-away portion recessed from the other long side and corresponding to the projecting part.

According to the semiconductor device of a typical embodiment disclosed in this application, the characteristics of the semiconductor device can be improved.

According to the semiconductor device manufacturing method of a typical embodiment disclosed in this application, a semiconductor device with good characteristics can be manufactured.

BRIEF DESCRIPTION OF THE DRAWINGS

FIGS. 8A1, 8A2, 8B1, 8B2, and 8C show effective diffusion layer widths with cut-away portions famed or without any cut-away portion formed.

DETAILED DESCRIPTION

In the following, the description of the invention will be divided into two or more sections or will range over two or more embodiments as required for the sake of convenience. Unless otherwise expressed, such sections and embodiments are not mutually irrelevant. For example, among such sections and embodiments, one is a partial or total modification of another, one represents an application of another, or one elaborates or supplements another. Also, numbers referred to in the following description of embodiments (for example, numbers representing counts, numerical values, volumes, or ranges) do not represent defined values, that is, they may be smaller or larger unless otherwise expressed or except when they are apparently defined in principle.

Furthermore, the constituent elements (including element steps) of the following embodiments are not necessarily indispensable unless otherwise expressed or except when they are considered apparently indispensable in principle. Similarly, the shapes of and positional relationships between constituent elements referred to in the following description are inclusive of those substantially close to or similar to them unless otherwise expressed or except when such shapes and positional relationships are apparently considered strictly defined in principle. This also applies to the numbers (for example, numbers representing counts, numerical values, volumes, or ranges).

Embodiments of the present invention will be described below in detail with reference to drawings. Note that, in all drawings referred to in describing the following embodiments, members having identical functions are denoted by identical or related symbols and such members will not be repeatedly described. Also, in cases where plural similar members (parts) are involved, individual or specific ones among such plural similar members (parts) may be denoted by generic symbols added to by individual or specific symbols. Also, as a rule, in describing the following embodiments, identical or similar parts will not be repeatedly described except when particularly necessary.

Also, in drawings referred to in describing the following embodiments, hatching may be omitted even in sectional views to make the sectional views easier to understand. Also, even in plan views, hatching may be used to make the plan views easier to understand.

In sectional views or plan views, parts are not necessarily represented to correspond to their real sizes. Particular parts may be represented to be relatively larger to make the drawings easier to understand. This also applies to sectional views and plan views which mutually correspond.

First Embodiment

Figure 1:
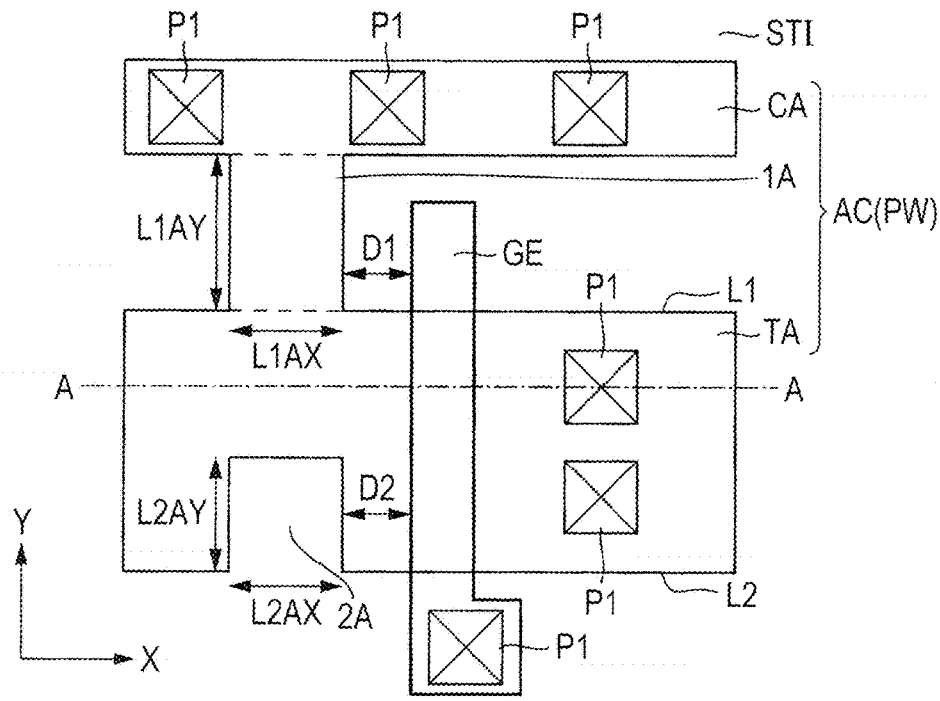
FIG. 1 is a plan view schematically showing a structure of a semiconductor device of a first embodiment.
Figure 2:
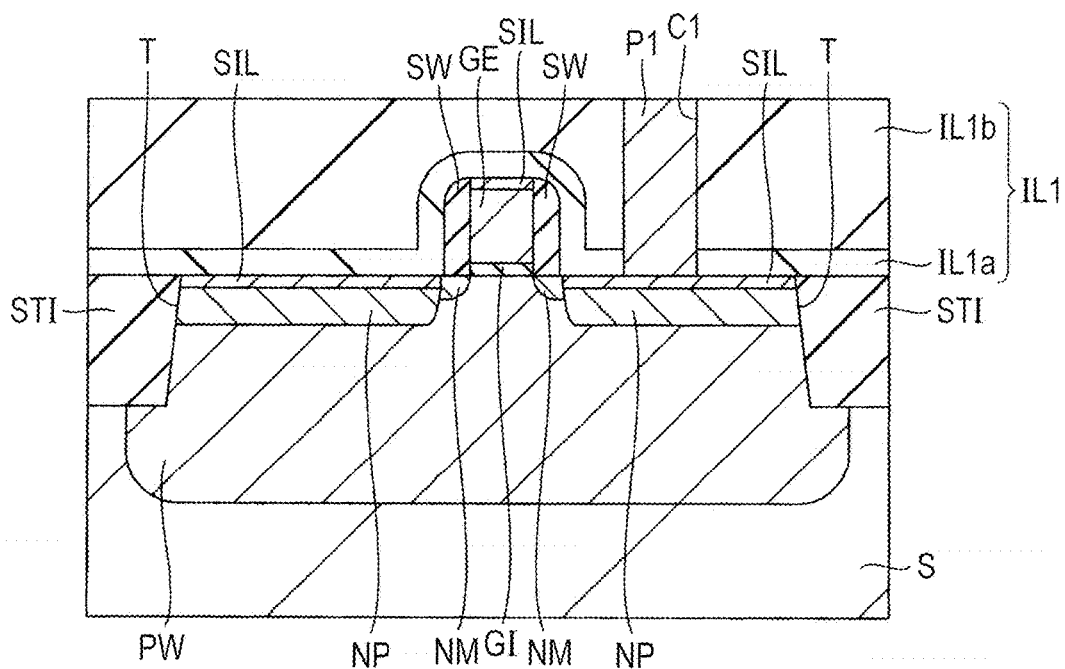
FIG. 2 is a sectional view showing the structure of the semiconductor device of the first embodiment.

The structure of a semiconductor device according to a first embodiment of the present invention will be described below with reference to drawings.
<Structure>
FIG. 1 is a plan view schematically showing the structure of the semiconductor device of the first embodiment. FIG. 2 is a sectional view of the structure of the semiconductor device of the first embodiment. FIG. 2 represents a sectional view along line A-A in FIG. 1.

As shown in FIGS. 1 and 2, the semiconductor device of the present embodiment includes a MOS transistor. The following description is based on the assumption that the MOS transistor is an n-type MOS transistor (also referred to as an "n-channel MOSFET").

The n-type MOS transistor is formed over a main surface of a p-well region (also referred to as a "p-type diffusion layer region") PW formed in the semiconductor substrate S. Namely, the n-type MOS transistor includes a gate electrode GE formed, via a gate insulation film GI, over the p-well region PW and source and drain regions (diffusion layers) formed, to be on both sides of the gate electrode GE, in the semiconductor substrate S (in the p-well region PW). The source and drain regions each include a low-concentration n-type semiconductor region NM and a high-concentration n-type semiconductor region NP. This structure is referred to as an LDD (lightly-doped-drain) structure. A sidewall insulation film SW is formed on each side of the gate electrode GE. The low-concentration n-type semiconductor regions NM are self-alignedly formed on both sides of the gate electrode GE. The high-concentration n-type semiconductor regions NP are self-alignedly formed on both sides of the sidewall insulation films SW.

Metal silicide layers SIL (metal silicide films) are formed over the high-density n-type semiconductor regions NP and the gate electrode GE using, for example, salicide (self-aligned silicide) technology. The metal silicide films SIL are formed of, for example, cobalt silicide layers. Plugs (contact parts) P1 are formed over the metal silicide layers SIL. The plugs P1 are each formed of a conductive film filled in a coupling hole C1 formed in an interlayer insulation film IL1.

The above n-type MOS transistor is formed in an active region AC surrounded by an element isolation part STI (see FIG. 1). The element isolation part STI is formed of an insulation film filled in an element isolation trench T. The active region AC is, for example, an exposed area of the p-well region PW. The n-type MOS transistor of the present embodiment is formed in a transistor area TA of the active region AC.

The transistor area TA is a rectangular area with long sides extending in the X direction. The gate electrode GE formed to be approximately rectangular with long sides extending in the Y direction extends traversing the transistor area TA. At one end of the gate electrode Ge, a wide part is formed and a plug P1 is formed over the wide part. In the transistor area Ta, the source and drain regions are formed on both sides of the gate electrode GE, respectively. Referring to FIG. 1, the region on the left side of the gate electrode GE is coupled to a contact area CA (also referred to as a "power supply coupling area") via an extension part (also referred to as a "projecting part"). In this structure, where the extension part 1A extends from the transistor area TA is bent. Thus, the active region AC includes the transistor area TA, extension part 1A and contact area CA. The transistor area TA also includes a cut-away portion 2A corresponding to the extension part 1A.

Namely, the transistor area TA includes the extension part 1A projecting from a side L1 (long side) extending in the X direction and the cut-away portion 2A recessed from a side (long side) L2 extending in the X direction. These parts are formed at least in the source/drain region on one side (on the left side in FIG. 1) of the gate electrode GE. The extension part 1A has an X-direction dimension denoted as L1AX and a Y-direction dimension denoted as L1AY. The cut-away portion 2A has an X-direction dimension denoted as L2AX and a Y-direction dimension denoted as L2AY. D1 denotes the distance between the extension part 1A and the gate electrode GE. D2 denotes the distance between the cut-away portion 2A and the gate electrode GE.

Forming, as described above, the cut-away portion 2A on the side L2 opposing the side L1 where the extension part 1A is formed makes it possible to miniaturize the semiconductor device and facilitates improving the characteristics of the semiconductor device.

Figure 3:
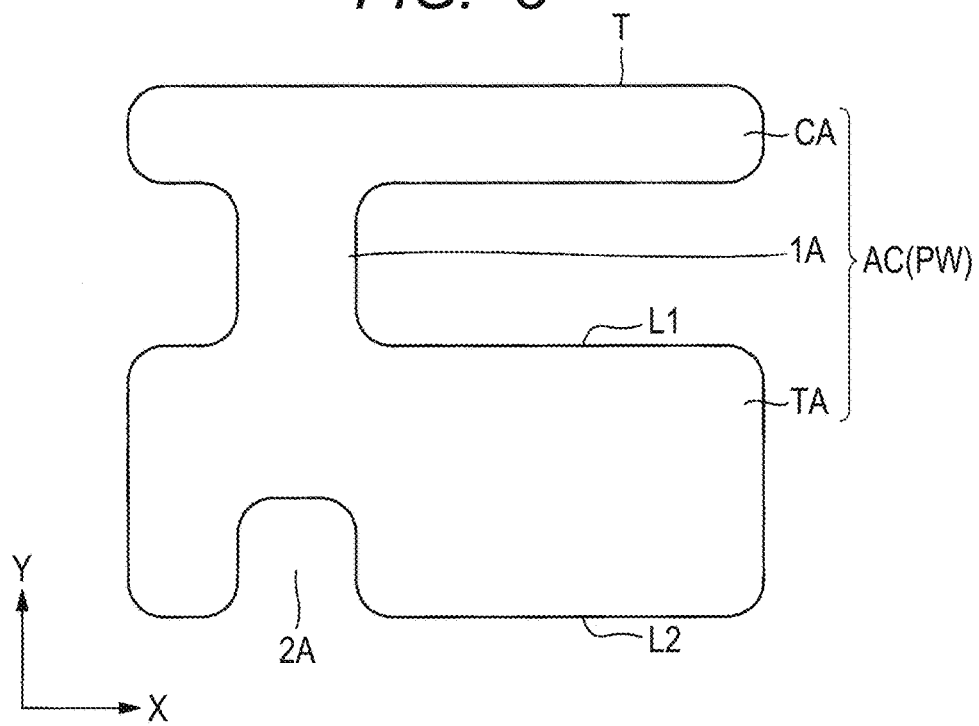
FIG. 3 is a plan view showing an active region of the semiconductor device of the first embodiment.
Figure 4:
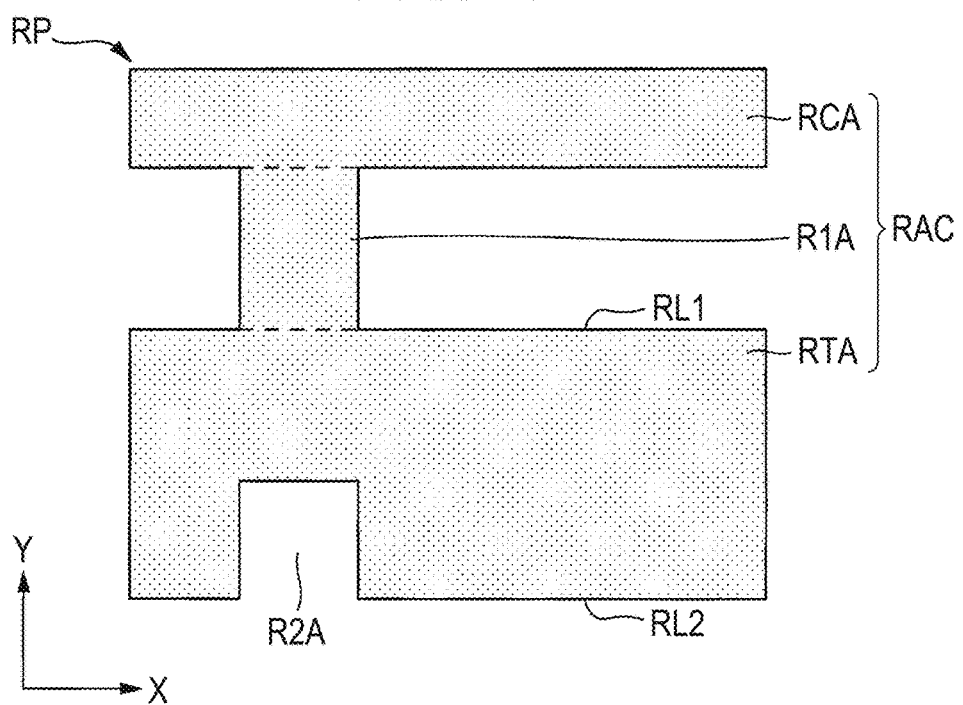
FIG. 4 is a plan view showing a reticle pattern for use in a manufacturing process for the semiconductor device of the first embodiment.

FIG. 3 is a plan view showing the active region of the semiconductor device of the present embodiment. FIG. 4 is a plan view showing a reticle pattern for use in a manufacturing process for the semiconductor device of the present embodiment.

Though, in FIG. 1, the active region AC is represented, reflecting the shape of the reticle pattern (also referred to as a "mask pattern"), as including corners formed by sides at approximately 90 degrees. In reality, however, the active region AC forms rounded corners as shown in FIG. 3.

Such rounded portions are formed, for example, as follows: (1) when a photoresist film PR is exposed and is processed for development, pattern corners are rounded due to optical image blurring; (2) pattern corners are rounded in an etching process performed using a photoresist as a mask; and (3) pattern corners are rounded when a reticle pattern is first formed. It is, therefore, difficult to form, for example, in the pattern of the active region AC, corners defined by sides at about 90 degrees where the side L1 extending in the X direction and the extension part 1A. Thus, the corners of the active region AC are rounded as shown in FIG. 3.

Figure 5:
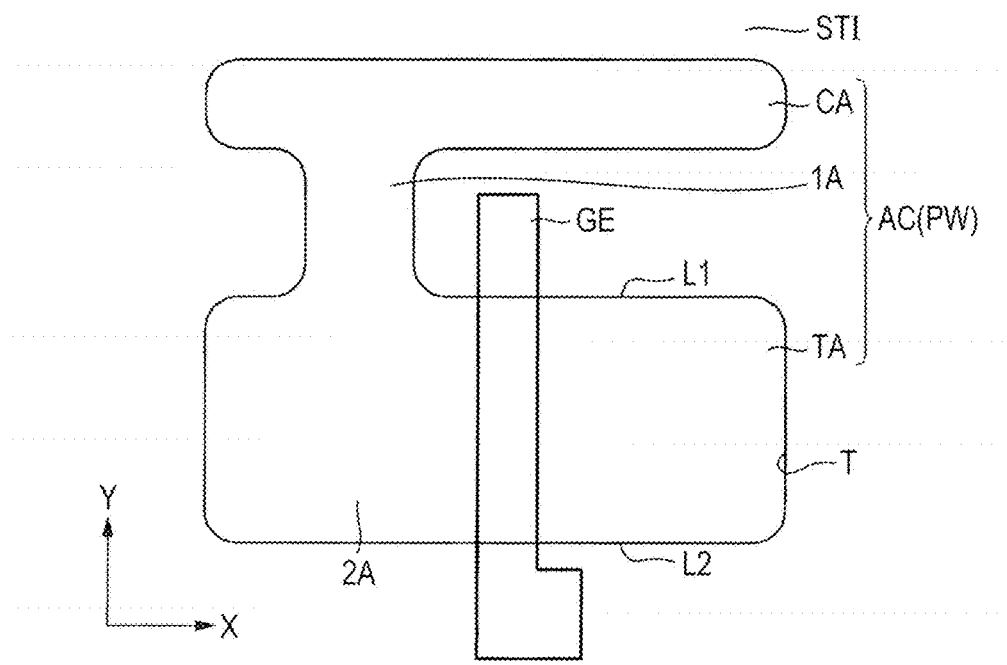
FIG. 5 is a plan view showing a structure of a semiconductor device of an example for comparison.
Figure 6A:
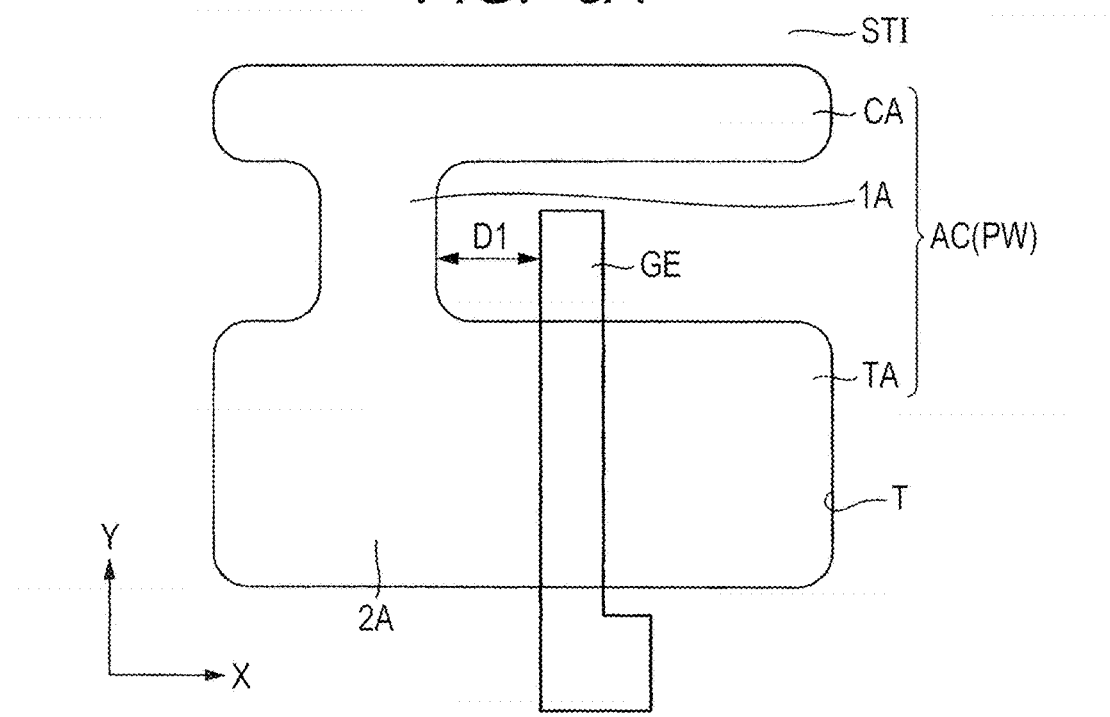
FIGS. 6A and 6B are each a plan view showing a structure of a semiconductor device according to an example for comparison.
Figure 6B:
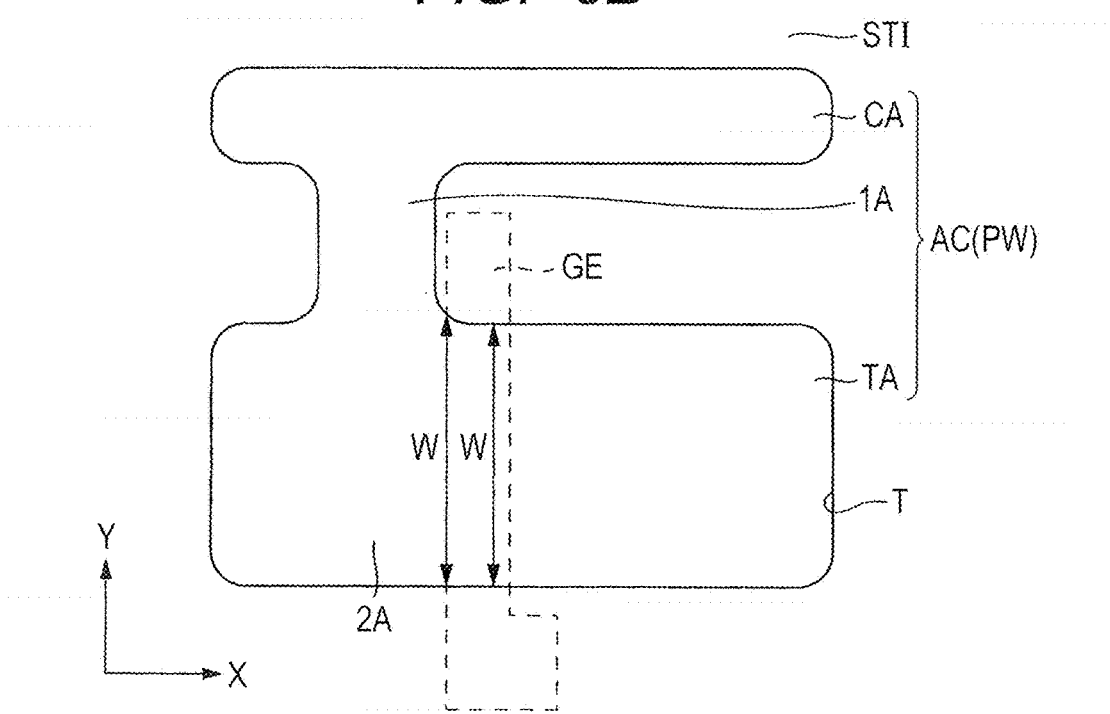

When the active region AC has rounded portions with the gate electrode GE formed, as shown in FIG. 5, near where the extension part 1A extends from the side L1 that extends in the X direction, it is necessary to increase distance D1 between the extension part 1A and the gate electrode GE not to allow the gate electrode GE to overlap a nearby rounded portion. For example, the distance D1 is required to be 60 nm or larger. When, without the above consideration made, the electrode gate GE is formed, as shown in FIG. 6B, near the extension part 1A for the sake of device miniaturization, the gate electrode GE overlaps the nearby rounded portion of the active region AC and causes the gate width W to increase. FIGS. 5, 6A and 6B are plan views showing example arrangements of a semiconductor device for comparison.

As described above, the example semiconductor device for comparison does not enable promotion of semiconductor device miniaturization. Also, gate width variation in the example semiconductor device prevents desired characteristics from being maintained.

Figure 7:
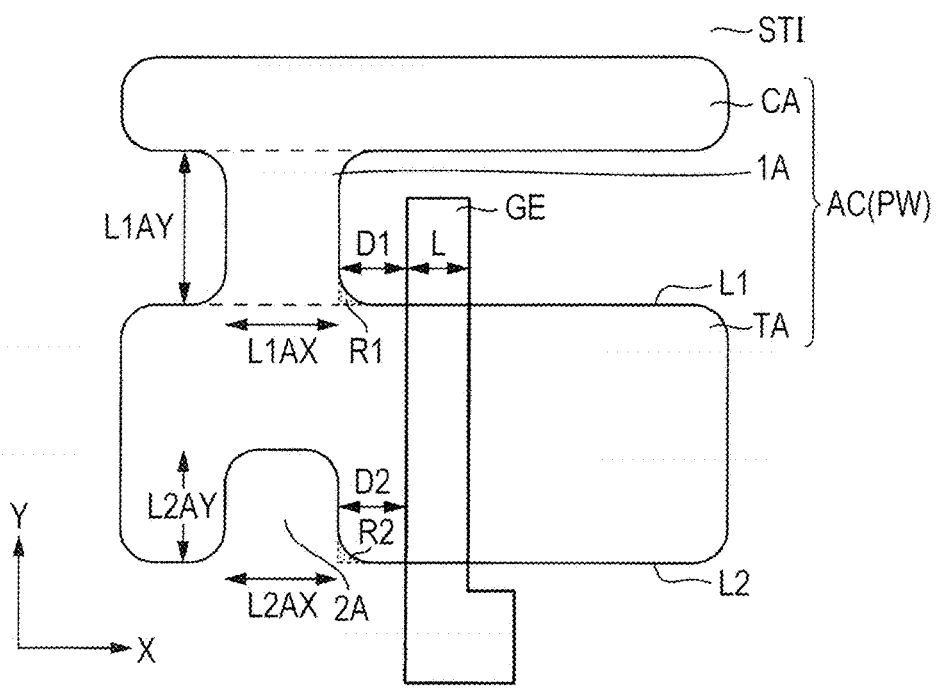
FIG. 7 is a plan view showing the structure of the semiconductor device of the first embodiment.

According to the present embodiment, on the other hand, the cut-away portion 2A is formed, as shown in FIG. 7, to be corresponding to the extension part 1A, and the corners formed where the cut-away portion 2A meets the side L2 that extends in the X direction are rounded, thereby, decreasing the area of the active region AC. This decrease of the area of the active region AC caused by formation of the rounded portions where the cut-away portion 2A meets the side L2 that extends in the X direction makes up for the decrease caused by the rounded portions where the extension part 1A meets the side L1 that extends in the X direction. The active region AC portions increased by the rounded portions formed where the extension part 1A meets the side L1 that extends in the X direction are each denoted as rounded portion R1. The active region AC portions decreased by the rounded portions formed where the cut-away portion 2A meets the side L2 that extends in the X direction are each denoted as rounded portion R2.

Since the increases of the area of the active region AC caused by formation of the rounded portions R1 are canceled by the decreases of the area of the active region AC caused by formation of the rounded portions R2, forming the gate electrode GE near the extension part 1A does not vary the gate width (W). This improves the characteristics of the MOS transistor. In this way, it is also possible to reduce the distance between the extension part 1A and the gate electrode GE, so that miniaturization of the MOS transistor can be promoted. FIG. 7 is a plan view showing the structure of the semiconductor device of the present embodiment.

Figure 8C:
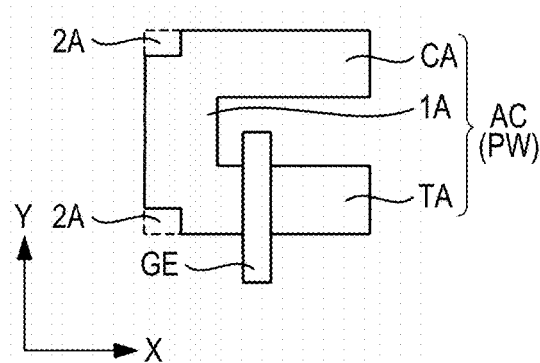
Figure 8C:
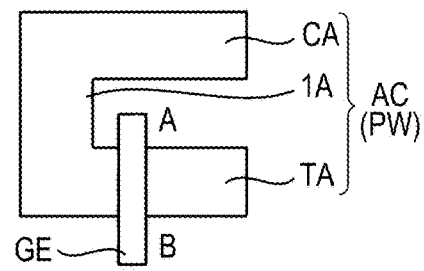
Figure 8C:
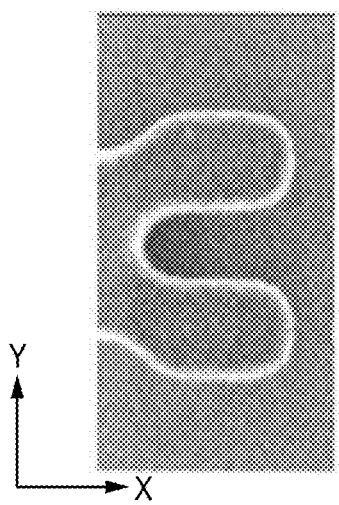
Figure 8C:
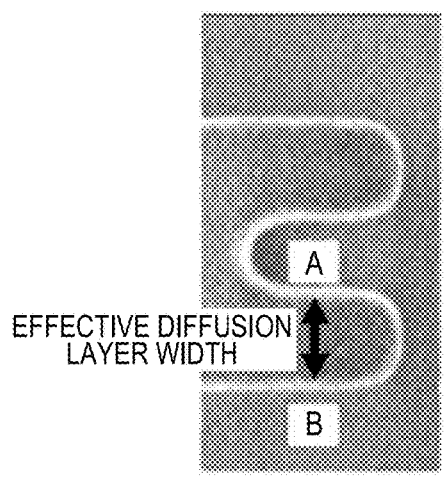
Figure 8C:
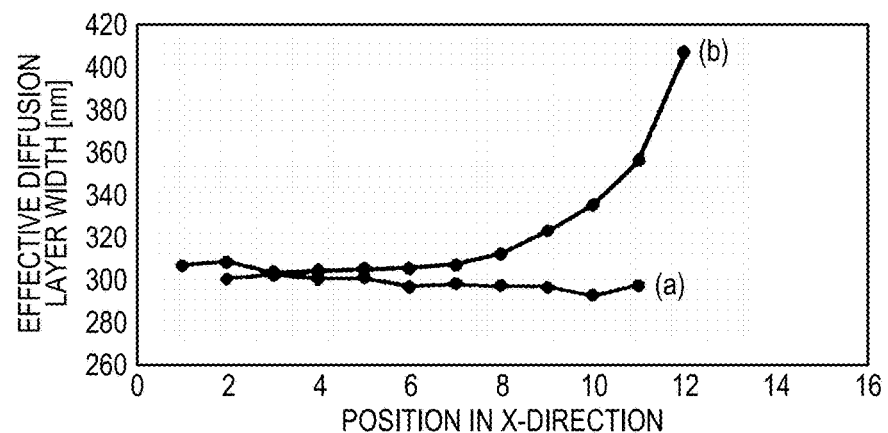

FIGS. 8A1, 8B1, 8A2, 8B2 and 8C show effective diffusion layer widths with and without cut-away portions formed. Studies have been made on a case (see FIG. 8A1) where the active region AC in which the transistor area TA and the contact area CA both extending in the X direction are coupled by the extension part 1A extending in the Y direction and which includes cut-away portions 2A and on another case (see FIG. 8B1) where the active region AC includes no cut-away portions 2A. FIG. 8A2 shows an SEM image of the active region AC including cut-away portions 2A. FIG. 8B2 shows an SEM image of the active region AC including no cut-away portions 2A. The active region AC shown in FIG. A1 and FIG. A2 includes two cut-away portions 2A for better symmetry.

As comparison between FIGS. A2 and B2 makes apparent, in the case shown in FIG. B2, the distance between active regions A and B that represents an effective diffusion layer width is larger toward the extension part 1A in the direction from right to left in the figure. In the case shown in FIG. A2, with the cut-away portions 2A formed, the effective diffusion layer width (between A and B) remains almost unchanged toward the extension part 1A in the direction from right to left in the figure, even though the effective diffusion layer width shifts upward. FIG. 8C shows the effective diffusion layer width (nm) with respect to the position in the X-direction. The position value along the X axis is larger toward the extension part 1A. In FIG. 8C, curve b corresponds to FIG. 8B2 with no cut-away portions formed and curve a corresponds to FIG. 8A2 with cut-away portions 2A formed. As shown, the effective diffusion layer width represented by curve b is larger toward the extension part 1A in the X direction, whereas the effective diffusion layer width represented by curve a remains almost unchanged toward the extension part 1A in the X direction.

As described above, according to the present embodiment, by forming the cut-away portion 2A on the side L2 opposing the side L1 where the extension part 1A is formed, variation occurring between the extension part 1A and the gate electrode GE of the effective diffusion layer width can be inhibited. This reduces the gate width variation and facilitates improvement of the characteristics of the semiconductor device. Also, even in cases where the distance between the extension part 1A and the gate electrode GE is reduced, desired characteristics of the semiconductor device can be maintained and miniaturization of the semiconductor device can be facilitated.

Next, description will be made on the size of the cut-away portion 2A and the positional relationships between the extension part 1A, gate electrode GE and cut-away portion 2A. FIGS. 9A to 9D illustrate cut-away portion sizes and the positional relationships between the extension part, gate electrode and cut-away portion.

Figure 9A:
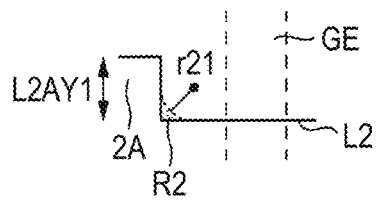
FIGS. 9A, 9B, 9C, and 9D are diagrams showing cut-away portion sizes and positional relationships between an extension part, a gate electrode and a cut-away portion.
Figure 9B:
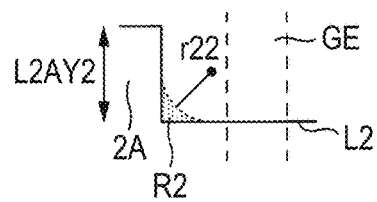
Figure 9C:
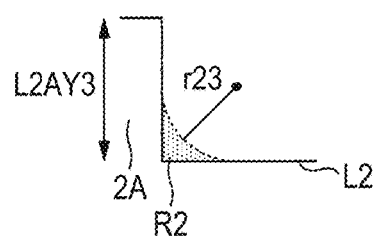

As shown in FIGS. 9A, 9B and 9C, as the length (L2AY) in the Y-direction of the cut-away portion 2A increases in the order of L2AY1, L2AY2 and L2AY3, the rounded portion (the active region AC portion decreased where the cut-away portion 2A meets the side L2 extending in the X direction) R2 becomes correspondingly larger. In other words, as the length (L2AY) in the Y direction of the cut-away portion 2A increases, curvature radius at the edge of the rounded portion R2 becomes larger. Also, as the length (L2AY) in the Y direction of the cut-away portion 2A increases, the curve at the edge of the rounded portion R2 becomes gentler. Also, as the length (L2AY) in the Y direction of the cut-away portion 2A increases, the curvature radius of the edge of the rounded portion R2 becomes smaller.

As described above, the size of the rounded portion R2 can be adjusted by adjusting the length (L2AY) in the Y direction of the cut-away portion 2A. The length (L2AY) in the Y direction of the cut-away portion 2A corresponds, for example, to the imaginary length of, out of the sides extending in the Y direction of the approximately rectangular cut-away portion 2A, the side on the gate electrode GE side.

Though in FIG. 1, the distance D1 between the extension part 1A and the gate electrode GE is about the same as the distance D2 between the cut-away portion 2A and the gate electrode GE, the distance D2, hence the position of the cut-away portion 2A, need not be as shown in FIG. 1.

Figure 9D:
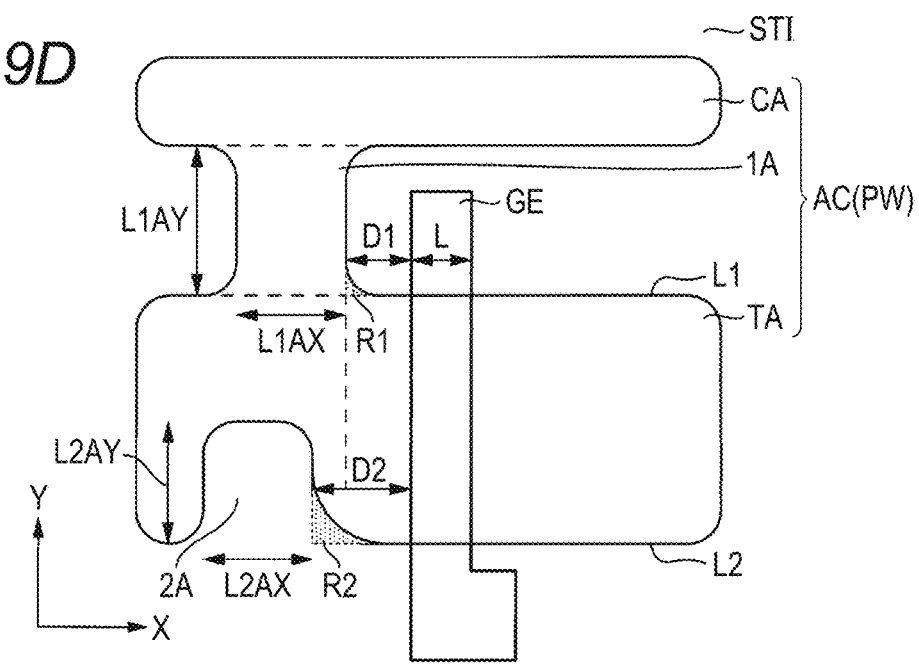

For example, as shown in FIG. 9D, even when the distance D2 is larger than the distance D1, it is possible, by making the rounded portion R2 large, to cancel the increase of the area of the active region AC caused by formation of the rounded portion R1 by the decrease of the area of the active region AC caused by formation of the rounded portion R2 as described with reference to FIG. 7.

The positional relationships between the extension part 1A, gate electrode GE and cut-away portion 2A are preferably as follows.

The distance D1 preferably does not exceed two times the gate length L (D1≤2×L). The distance D2 is preferably equal to or larger than the distance D1 while being equal to or smaller than the sum of the distance D1 and two times the length (L2AX) in the X direction of the extension part 1A (D1≤D2≤(D1+2×L2AX)). The distance D2 is more preferably equal to or larger than the distance D1 while being equal to or smaller than the sum of the distance D1 and the length (L2AX) in the X direction of the extension part 1A (D1≤D2≤(D1+L2AX)). In this case, of the sides extending in the Y direction of the approximately rectangular cut-away portion 2A, the side on the gate electrode GE side is positioned correspondingly to the extension part 1A.

As described above, the size of the cut-away portion 2A and the relationships between the extension part 1A, gate electrode GE and cut-away portion 2A can be varied. For example, concerning the shapes of the reticle pattern and rounded portions R1 and R2, the shape and position of the cut-away portion 2A can be adjusted using a lithography simulator or based on experimental data.

<Manufacturing Method>

Next, with reference to FIGS. 10 to 21, a method of manufacturing the semiconductor device of the present embodiment will be described and the structure of the semiconductor device of the present embodiment will be made clear. FIGS. 10, 11, 13 and 15 to 21 are sectional views each illustrating a manufacturing process for the semiconductor device of the present embodiment. FIG. 12 is a plan view of a reticle pattern for use in a manufacturing process for the semiconductor device of the present embodiment. FIG. 14 is a plan view showing a manufacturing process for the semiconductor device of the present embodiment.

Figure 10:
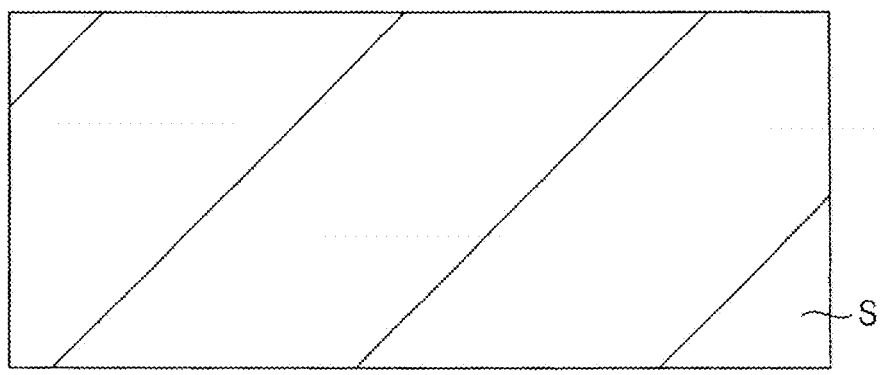
FIG. 10 is a sectional view showing a manufacturing process for the semiconductor device of the first embodiment.

First, as shown in FIG. 10, a semiconductor substrate S is prepared. The semiconductor substrate S is, for example, a p-type monocrystal silicon substrate with a specific resistance of, for example, 1 to 10 Ωcm.

Figure 11:
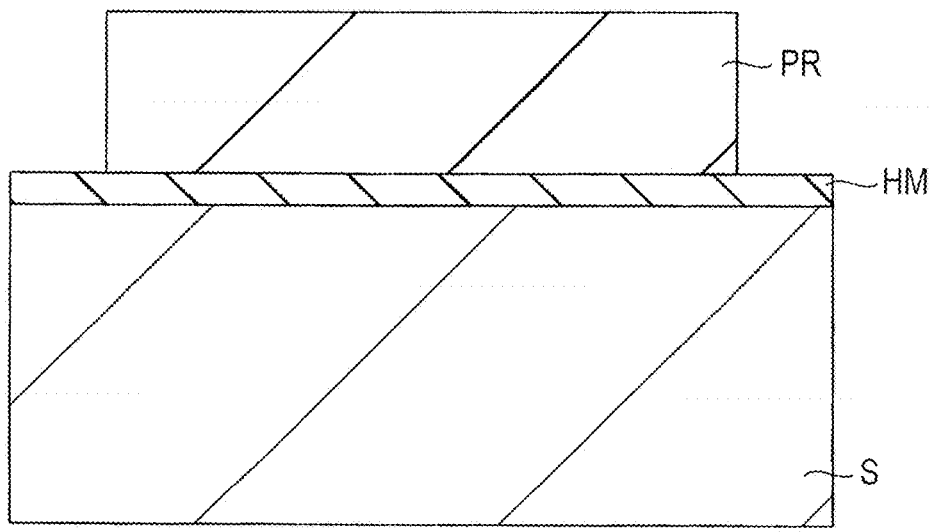
FIG. 11 is a sectional view showing a manufacturing process for the semiconductor device of the first embodiment.
Figure 12:
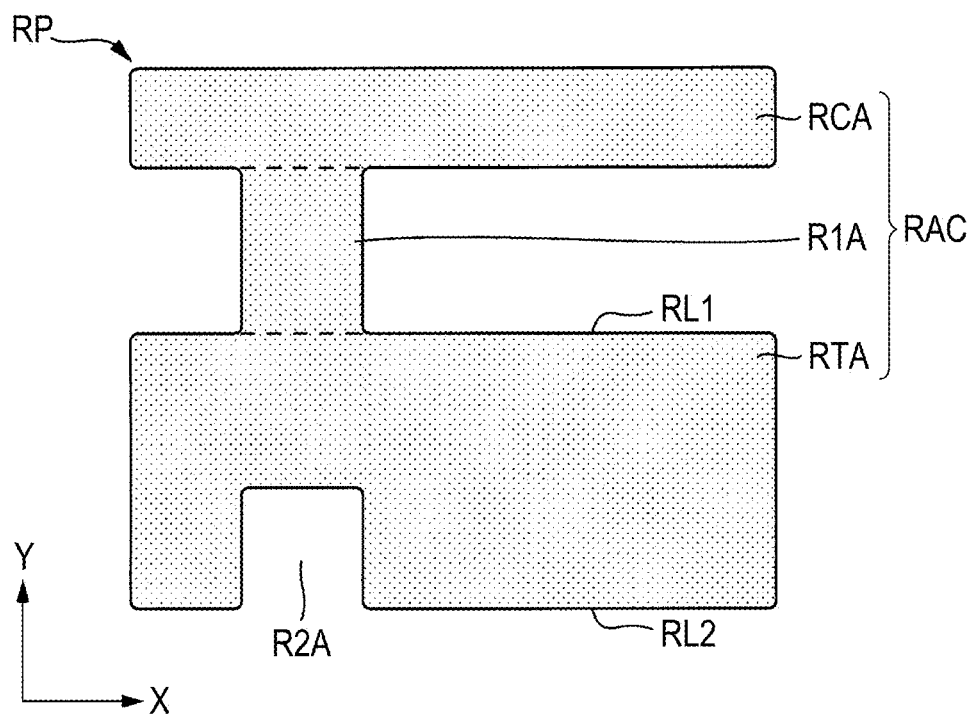
FIG. 12 is a plan view showing a reticle pattern for use in a manufacturing process for the semiconductor device of the first embodiment.

Next, as shown in FIG. 11, a hard mask HM (e.g. a film stack including a silicon oxide film and a silicon nitride film formed over the silicon oxide film) is formed over the semiconductor substrate S, then a photoresist film PR is formed over the hard mask HM. Next, by performing exposure and development using a photolithography technique, the photoresist film PR in an element isolation region (also referred to as an "isolating insulation region") is removed. For example, a reticle pattern RP shown in FIG. 12 is transferred (by exposure) to the photoresist film PR and the photoresist film PR portion in other than the element isolation region (in the active region) is hardened. Then, by applying a developing solution to the photoresist film PR, the photoresist film PR portion in the element isolation region is removed. The reticle pattern RP includes parts (RTA, R1A, RCA, R2A) corresponding to the transistor area TA, extension part LA, contact area CA and cut-away portion 2A. Patterns processed using the reticle pattern RP need not correspond in size to the reticle pattern RP on a 1:1 basis. There are cases in which they are reduced in size.

In the above process, the photoresist film PR being processed may form rounded portions corresponding to the corner portions rounded as described in the foregoing of the reticle pattern RP (see FIG. 12). The photoresist film PR may also form rounded portions depending on the photosensitivity of the photoresist film PR. Furthermore, the photoresist film PR may also form rounded portions when subjected to development.

Next, the hard mask HM is etched using the photoresist film (mask film) PR as a mask, then the photoresist film PR is removed, for example, by asking. Corner rounding may also occur when the hard mask HM is etched. Film processing (in the present case, processing of the hard mask HM) performed by photolithography and etching as described above is referred to as patterning.

Figure 13:
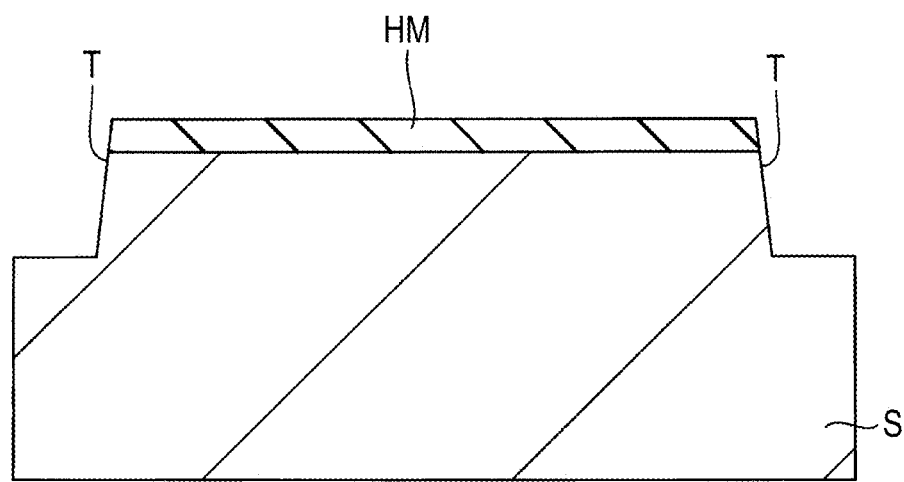
FIG. 13 is a sectional view showing a manufacturing process for the semiconductor device of the first embodiment.
Figure 14:
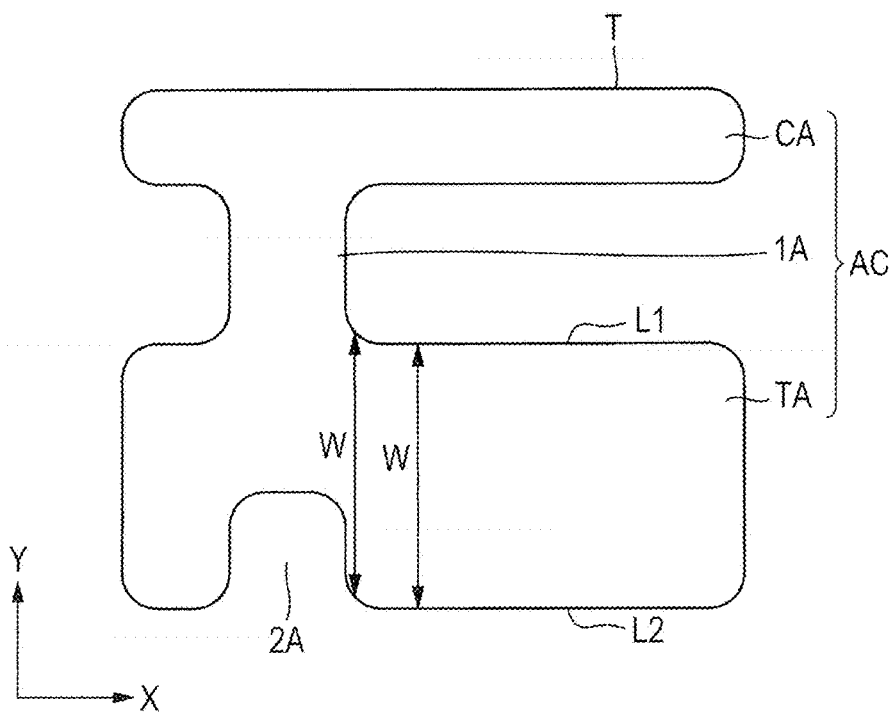
FIG. 14 is a plan view showing a manufacturing process for the semiconductor device of the first embodiment.
Figure 15:
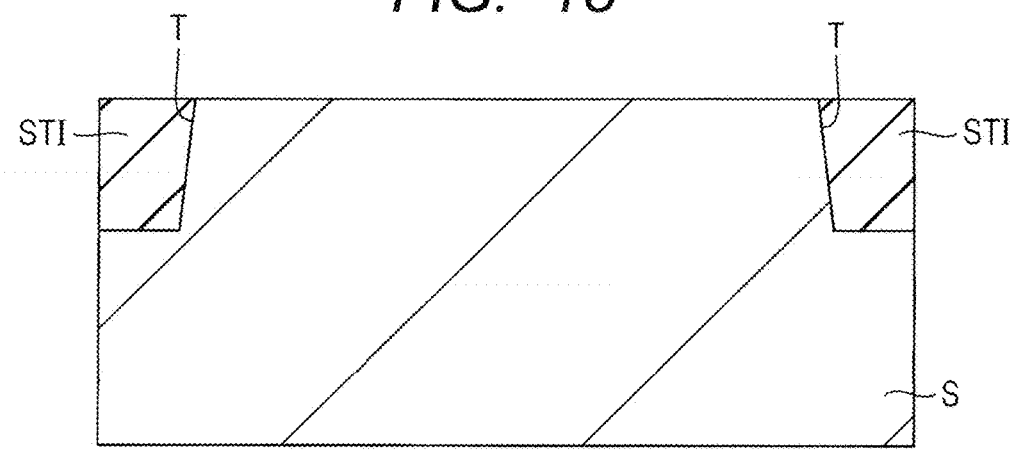
FIG. 15 is a sectional view showing a manufacturing process for the semiconductor device of the first embodiment.

Next, as shown in FIG. 13, the element isolation trench T is formed by etching the semiconductor substrate S using the hard mask (mask film) HM. Namely, the active region AC defined by the element isolation trench T is formed (see FIG. 14). At this time, the pattern as seen in a plan view of the active region AC includes, as shown in FIG. 14, rounded portions. However, the increase caused by formation of the rounded portion R1 of the area of the active region AC is made up for by the decrease caused by formation of the rounded portion R2 of the area of the active region AC (see FIG. 7), so that the variation near the extension part 1A of the width W of the active region AC is inhibited.

Next, a silicon oxide film is deposited over the hard mask HM that includes the inside of the element isolation trench T using, for example, a CVD method. Then, the silicon oxide film outside the element isolation trench is removed using, for example, a CMP method. In this way, an insulation film like a silicon oxide film is filled in the element isolation trench and, thereby, the element isolation part STI is formed. This method of element isolation is called an STI (Shallow Trench Isolation) method. Subsequently, the hard mask HM is removed and the height of the element isolation part STI is adjusted (see FIG. 15).

Figure 16:
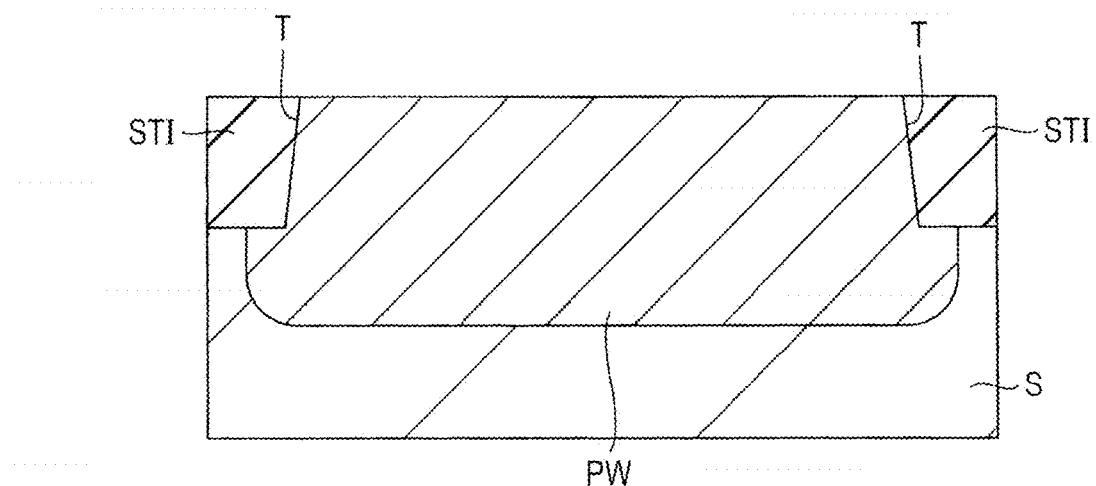
FIG. 16 is a sectional view showing a manufacturing process for the semiconductor device of the first embodiment.

Next, as shown in FIG. 16, a p-well region PW is formed in the semiconductor substrate (active region AC) S. This is done, for example, by ion-implanting p-type impurities into the semiconductor substrate (active region AC) S using a photoresist film (not shown) as a mask which has a pattern formed therethrough representing the p-well region PW to be formed. Subsequently, the photoresist film (not shown) is removed, for example, by asking.

Figure 17:
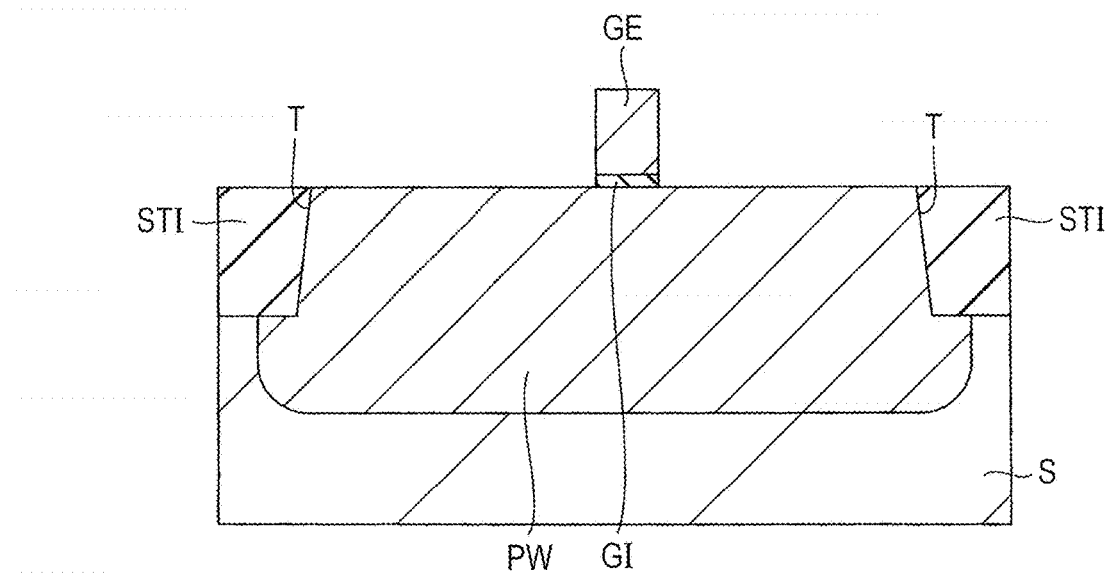
FIG. 17 is a sectional view showing a manufacturing process for the semiconductor device of the first embodiment.

Next, as shown in FIG. 17, the gate insulation film GI and the gate electrode GE are formed. For example, the gate insulation film GI formed of a silicon oxide film is formed over the surface of the p-well region PW by thermally treating the semiconductor substrate S (thermal oxidation treatment). The gate insulation film GI may be formed of, instead of a thermally oxidized film, a film formed by a CVD method. The film need not necessarily be an oxidized film. A nitride film or a high-dielectric-constant film (high-k film) may also be used. Next, a polycrystalline silicon film (gate electrode layer) is deposited as a conductive film over the gate insulation film GI, for example, by a CVD method. The gate electrode GE is formed by patterning the deposited polycrystalline silicon film using a photolithography technique and a dry etching technique.

Figure 18:
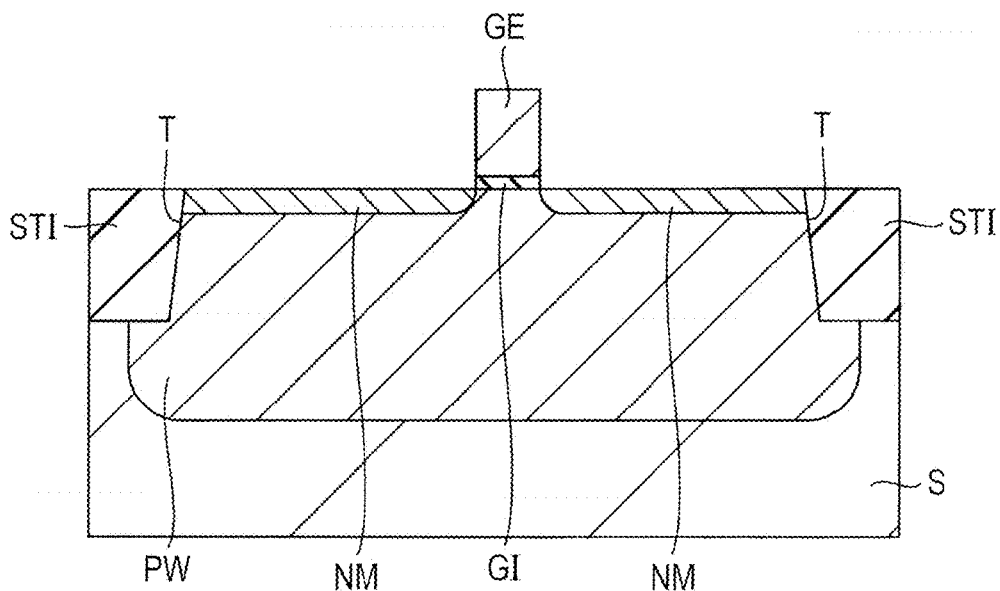
FIG. 18 is a sectional view showing a manufacturing process for the semiconductor device of the first embodiment.
Figure 19:
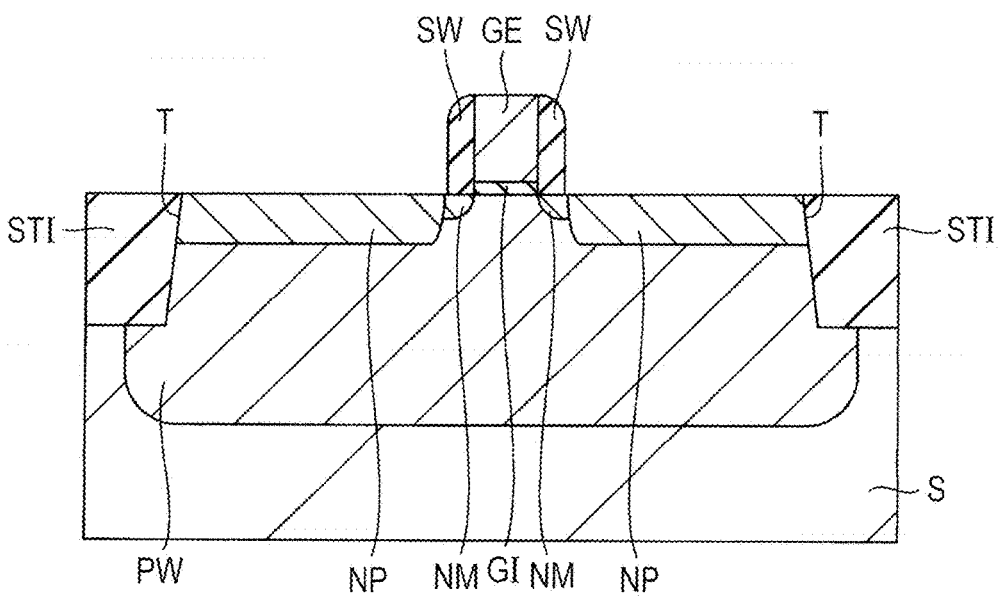
FIG. 19 is a sectional view showing a manufacturing process for the semiconductor device of the first embodiment.

Next, as shown in FIGS. 18 and 19, in the p-well region PW, the source and drain regions of an LDD structure are formed to be on both sides of the gate electrode GE, respectively. For example, as shown in FIG. 18, $n^-$-type semiconductor regions NM are formed by implanting n-type impurities (n-type impurity ions) such as arsenic (As) or phosphor (P) in p-well region PW portions on both sides of the gate electrode GE. At this time, the $n^-$-type semiconductor regions NM are formed being self-aligned to the side walls of the gate electrode GE. Next, as shown in FIG. 19, sidewall insulation films SW are formed over the sidewalls of the gate electrode GE. For example, the sidewall insulation films SW are formed over the sidewalls of the gate electrode GE by depositing an insulation film, for example, a silicon oxide film, over the semiconductor substrate S including the surface of the gate electrode GE and then etching back the insulation film. The sidewall insulation films SW may be formed of, besides a single-layered silicon oxide film, such an insulation film as a single-layered silicon nitride film or a stacked film including a silicon oxide film and a silicon nitride film.

Next, $n^+$-type semiconductor regions NP are formed by implanting n-type impurities such as arsenic (As) or phosphor (P) in p-well region PW portions on both sides of the gate electrode GE using the gate electrode GE and the sidewall insulation films SW for masking. At this time, the $n^+$-type semiconductor regions NP are formed being self-aligned to the sidewall insulation films SW formed over the sidewalls of the gate electrode GE. In this way, the source and drain regions of an LDD structure that include the $n^-$-type semiconductor regions NM and the $n^+$-type semiconductor regions NP are formed. The $n^+$-type semiconductor regions NP are higher in impurity concentration than the $n^-$-type semiconductor regions NM and are formed to be deeper than the $n^-$-type semiconductor regions NM.

Subsequently, the impurities implanted in the source and drain regions are activated by heat treatment (activation treatment).

The n-type MOS transistor can be formed through the above-described process. A p-type MOS transistor can be formed by reversing the above conductivity type of the impurities.

Figure 20:
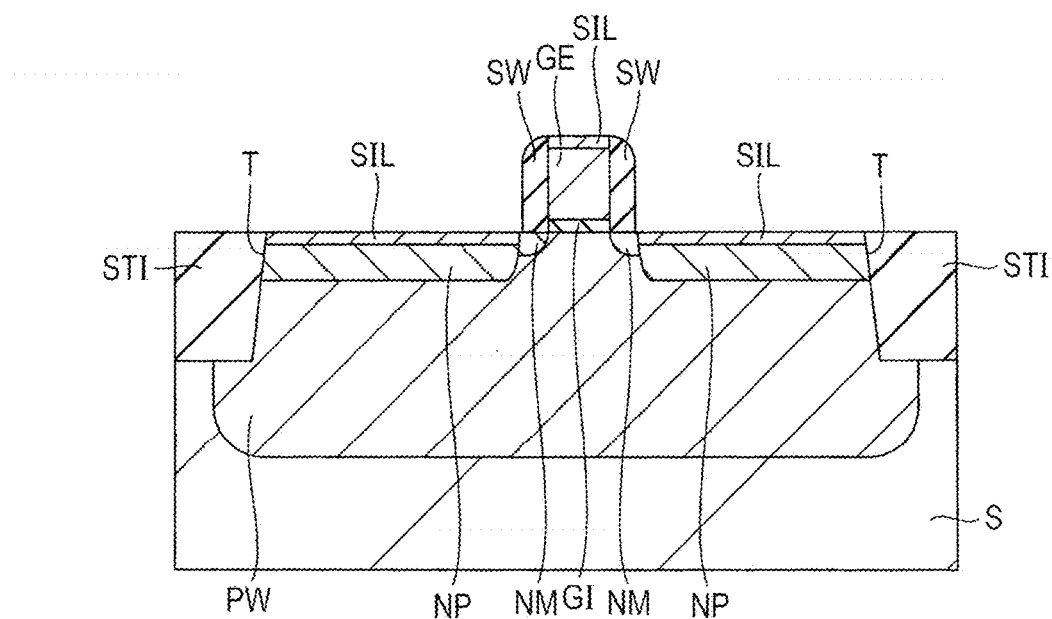
FIG. 20 is a sectional view showing a manufacturing process for the semiconductor device of the first embodiment.

Subsequently, as shown in FIG. 20, metal silicide layers SIL are formed over the source and drain regions ($n^+$-type semiconductor regions NP) and the upper side of the gate electrode GE using salicide technology. The metal silicide layers SIL can reduce the diffusion resistance and contact resistance. For example, a metal film such as a Co film is formed over the semiconductor substrate S including the upper side of the gate electrode GE, then the semiconductor substrate is heat-treated, thereby, causing reactions between the source and drain regions and the above metal film and between the gate electrode GE and the above metal film. As a result, metal silicide layers SIL formed of $CoSi_x$ (cobalt silicide) are formed over the source and drain regions ($n^+$-type semiconductor regions NP) and the upper side of the gate electrode GE are formed. Subsequently, unreacted metal film is removed.

Figure 21:
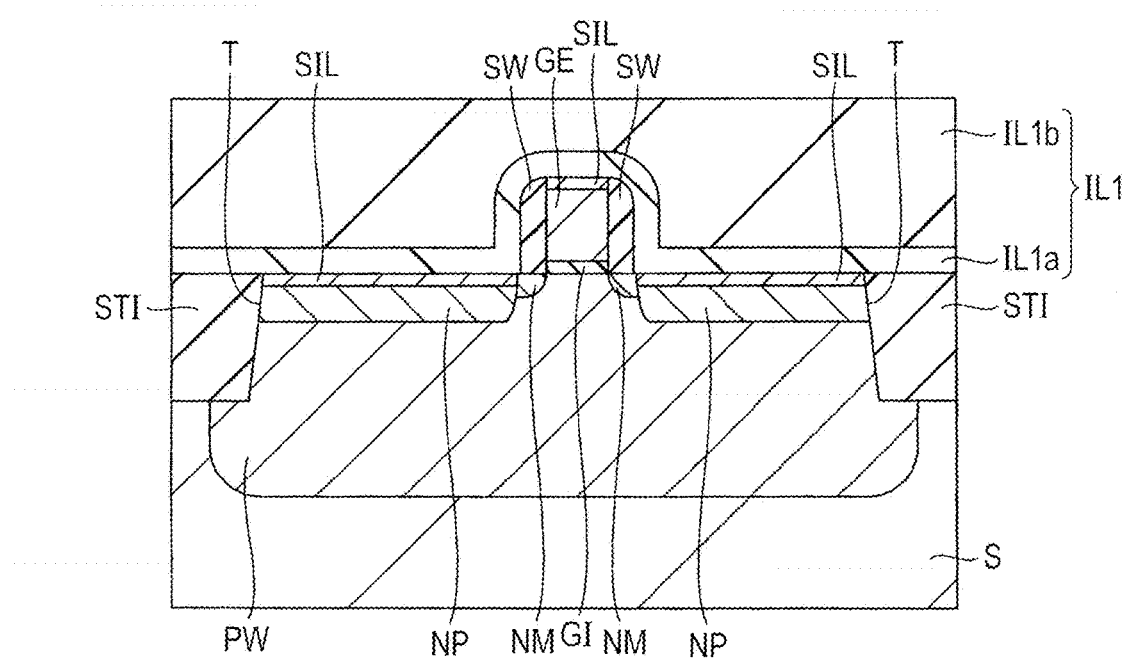
FIG. 21 is a sectional view showing a manufacturing process for the semiconductor device of the first embodiment.

Next, as shown in FIG. 21, an interlayer insulation film IL1 is formed. For example, an insulation film IL1a, for example, a silicon nitride film is formed over the semiconductor substrate S by a CVD method, then an insulation film IL1b formed of a relatively thick silicon oxide film is formed over the insulation film IL1a by a CVD method. In this way, the interlayer insulation film IL1 including a stack of the insulation films IL1a and IL1b is formed. Next, coupling holes C1 are formed by etching the interlayer insulation film IL1 (IL1a, IL1b) using a photoresist film (not shown) as a mask which has through-holes located to correspond to the regions where the plugs P1 are to be formed. Subsequently, the photoresist film (not shown) is removed, then a stacked film including a barrier film (not shown) and a metal film (e.g., a tungsten film) is deposited as a conductive film over the interlayer insulation film IL1 that includes the insides of the coupling holes C1. Finally, the conductive film outside the coupling holes C1 is removed, for example, by a CMP method. As described above, the plugs P1 are formed by depositing the conductive film in the coupling holes C1 (see FIGS. 1 and 2).

Subsequently, wiring (not shown) is formed over the interlayer insulation film IL1 that includes the upper sides of the plugs P1. For example, wiring can be formed by depositing a conductive film, for example, an aluminum film over the interlayer insulation film IL1 that includes the upper sides of the plugs P1 and patterning the deposited conductive film. Wiring may be formed by a damascene method. For example, wiring may be formed by forming an insulation film over the interlayer insulation film IL1, forming wiring trenches by patterning the insulation film, then filling a conductive film, for example, a copper film in the wiring trenches.

Also, wiring may be formed in multiple layers by repeating formation of an interlayer insulation film, plugs and wiring. In this case, for example, a protection film is formed over the top-layer wiring, then the protection film formed over the top-layer wiring is partly removed to expose parts (pad electrodes) of the top-layer wiring.

The semiconductor device of the present invention can be formed through the above processes.

Second Embodiment

As a second embodiment of the present invention, a semiconductor device manufacturing method in which a reticle pattern utilizing OPC correction and a cut-away portion is used will be described.

Figure 22:
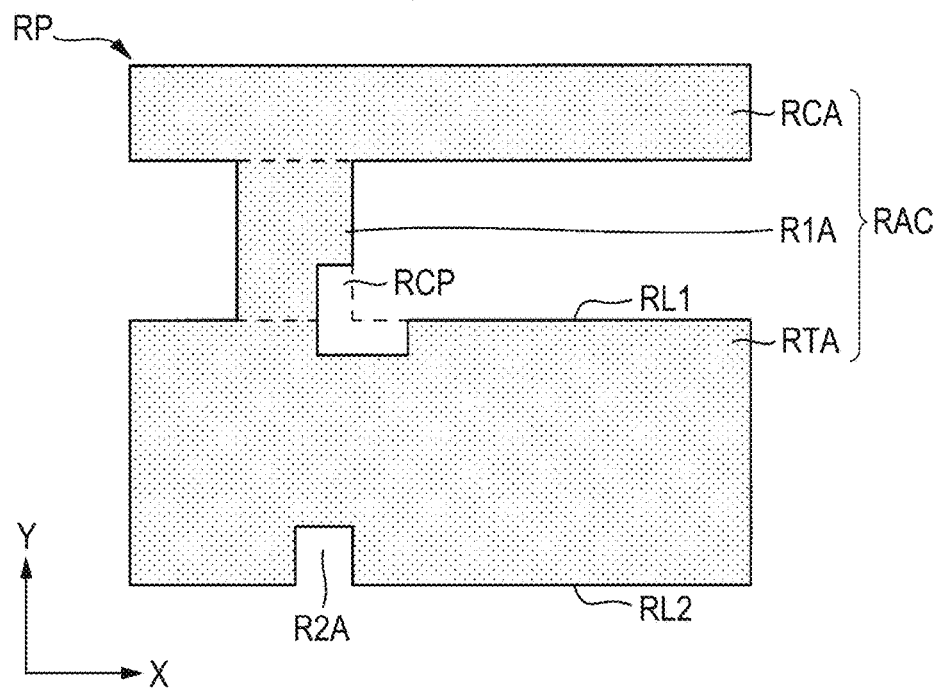
FIG. 22 is a plan view showing a reticle pattern for use in a manufacturing process for a semiconductor device of a second embodiment.
Figure 23:
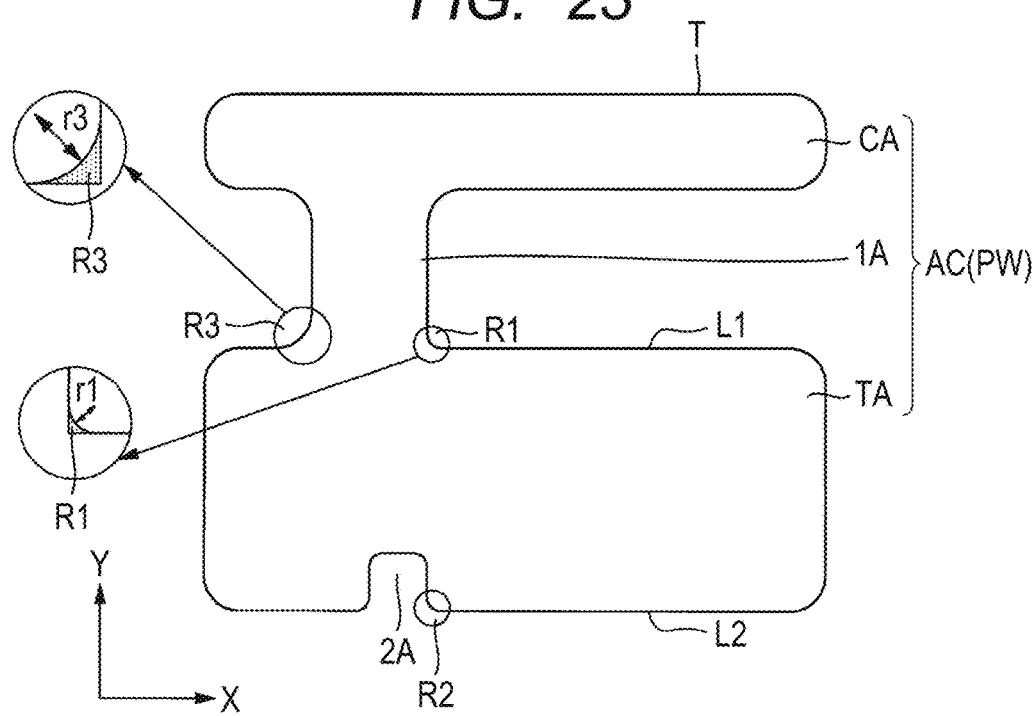
FIG. 23 is a plan view showing an active region of the semiconductor device of the second embodiment.

FIG. 22 is a plan view showing a reticle pattern for use in a manufacturing process for the semiconductor device of the second embodiment. FIG. 23 is a plan view showing an active region of the semiconductor device of the second embodiment.

As shown in FIG. 22, the reticle pattern RP includes parts (RTA, R1A, RCA and R2A) corresponding to a transistor area TA, extension part 1A, contact area CA and cut-away portion 2A. In the reticle pattern RP shown in FIG. 22, a correction pattern RCP based on OPC correction is formed where the part R1A corresponding to the extension part 1A meets the part RTA corresponding to the transistor area TA. In the present case, an approximately L-shaped cut-away pattern is formed as the correction pattern RCP where the part R1A meets the part RTA.

When a photoresist film, hard mask HM or semiconductor substrate S is processed using a reticle pattern which includes a correction pattern RCP, rounding of corners formed where, as seen in a plan view, adjacent portions of the part being processed is reduced, that is, corner curves become sharper to be more like right angles (see FIG. 23).

Referring to FIG. 23, a rounded portion R1 formed out of a corner, to which a correction pattern RCP is applied, of the active region AC and a rounded portion R3 formed out of a corner, to which no correction pattern is applied, of the active region AC will be compared below. The rounded portion R1 formed where the extension part 1A meets the side L1 extending in the X direction is located closer to the gate electrode (GE) than the rounded portion R3 also formed where the extension part 1A meets the side L1 extending in the X direction. The curvature radius r1 of the edge of the rounded portion R1 is smaller than the curvature radius r3 of the edge of the rounded portion R3. Also, the curvature of the edge of the rounded portion R1 is larger than the curvature of the edge of the rounded portion R3. Also, the edge of the rounded portion R1 is more sharply curved than the edge of the rounded portion R3. Thus, the curvature radius r1 of the rounded portion R1 located closer to the gate electrode (GE) can be made smaller by application of the correction pattern RCP.

When the curvature radius r1 of the rounded portion R1 is made smaller by applying the correction pattern RCP, the curvature radius of the rounded portion R2 formed by the cut-away portion 2A may also be smaller. Namely, as described in the foregoing, the length (L2AY) in the Y-direction of the cut-away portion 2A can be made shorter.

In the semiconductor device of the second embodiment, the structure, other than the planar shape, of the active region AC is the same as the structure described with reference to FIGS. 1, 2 and 7 in connection with the first embodiment. Also, the manufacturing process for the semiconductor device of the second embodiment is the same as the process described in connection with the first embodiment (see FIGS. 10 to 21) except that, in the second embodiment, the photoresist film PR (see FIG. 11) is formed over the hard mask HM using the reticle pattern shown in FIG. 22.

Even though in the second embodiment, the correction pattern RCP is an approximately L-shaped cut-away pattern, the correction pattern RCP may be shaped differently. In OPC correction, correction patterns are applied to corner portions of the shape of a reticle pattern, for example, by taking optical diffraction into consideration. For example, based on correction rules (as to, e.g., shapes and correction amounts) pre-determined based on data collected using a lithography simulator or by conducting experiments, shapes of correction patterns are determined, for example, using graphic pattern calculation functions of a layout verification tool (DRC).

Third Embodiment

In a third embodiment of the present invention, by forming a projecting portion 1A in an active region AC that includes a cut-away portion (recessed portion) 2A, variation of the width of an active region AC portion near a gate electrode GE is inhibited.

Figure 24:
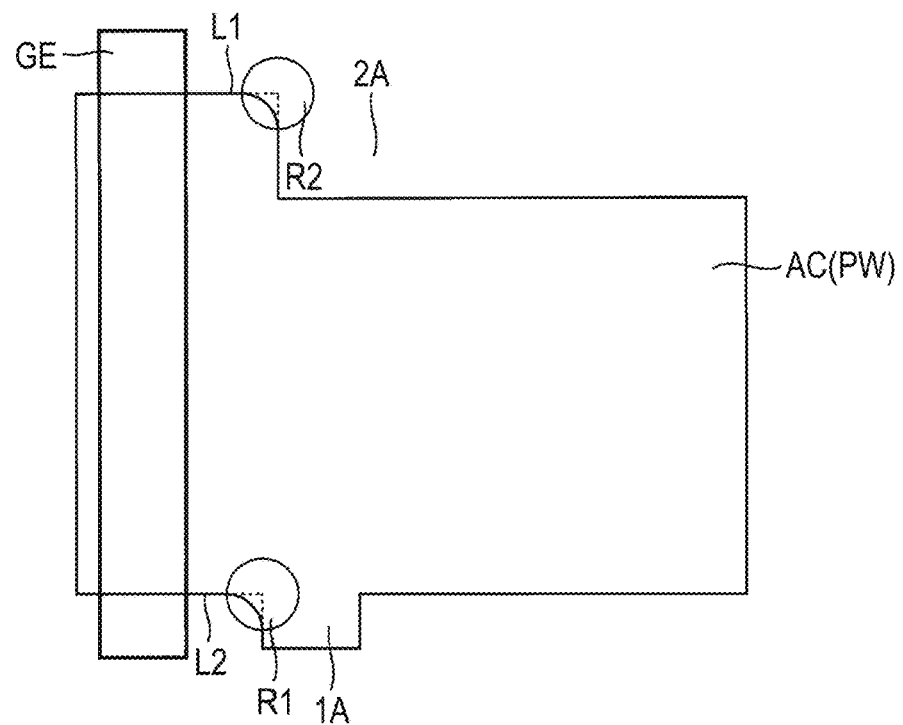
FIG. 24 is a plan view showing an active region of a semiconductor device of a third embodiment.
Figure 25:
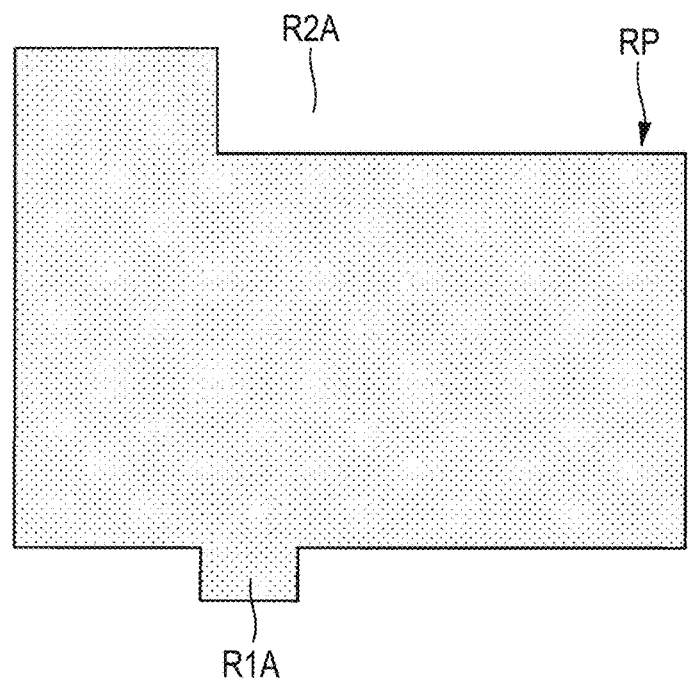
FIG. 25 is a plan view showing a reticle pattern for use in a manufacturing process for the semiconductor device of the third embodiment.

FIG. 24 is a plan view showing the active region of the semiconductor device of the third embodiment. FIG. 25 is a plan view showing a reticle pattern for use in a manufacturing process for the semiconductor device of the third embodiment.

In the third embodiment, as shown in FIG. 24, the active region AC includes the cut-away portion (recessed portion) 2A recessed from a side line L1 extending in the X direction. The active region AC also includes the projecting portion 1A located to correspond to the cut-away portion 2A. The gate electrode GE is formed near the cut-away portion (recessed portion) 2A and the projecting portion 1A and extends across the active region AC. The reticle pattern RP shown in FIG. 25 includes a portion R2A corresponding to the cut-away portion (recessed portion) 2A and portion R1A corresponding to the projecting portion 1A.

In this case, too, by forming the projecting portion 1A on the side L2 opposing the side L1 where the cut-away portion (recessed portion) 2A is formed, the decrease of the area of the active region AC caused by formation of the rounded portion R2 where the cut-away portion (recessed portion) 2A meets the side L1 extending in the X direction can be made up for by the increase of the area of the active region AC caused by formation of the rounded portion R1 where the projecting portion 1A projects from the side L2 extending in the X direction. In this way, even when the gate electrode GE is formed near the cut-away portion (recessed portion) 2A, variation of the gate width can be inhibited and the characteristics of the MOS transistor can be improved. Also, the distance between the cut-away portion (recessed portion) 2A and the gate electrode GE can be made small, so that miniaturization of the MOS transistor can be promoted.

In the semiconductor device of the third embodiment, the sectional shape of an active region AC portion in the vicinity of the gate electrode GE can be made the same as described with reference to, for example, FIG. 2 in connection with the first embodiment. Also, by using the reticle pattern shown in FIG. 25, the semiconductor device of the third embodiment can be formed in the same manner as for the semiconductor device of the first embodiment (see FIGS. 10 to 21).

Fourth Embodiment

According to the first to third embodiments described above, by giving consideration to the shape of the active region AC, corners in the vicinity of the gate electrode GE are rounded and, thereby, variation of the gate width is inhibited. There are, however, cases in which the gate length varies to possibly cause problems. For example, in wide parts (i.e., contact part and gate pad) of the gate electrode GE, rounding of corners in the vicinity of the active region AC can cause gate length variation. In a fourth embodiment, variation of the gate length is inhibited by adjusting the shape of the gate electrode GE.

Figure 26:
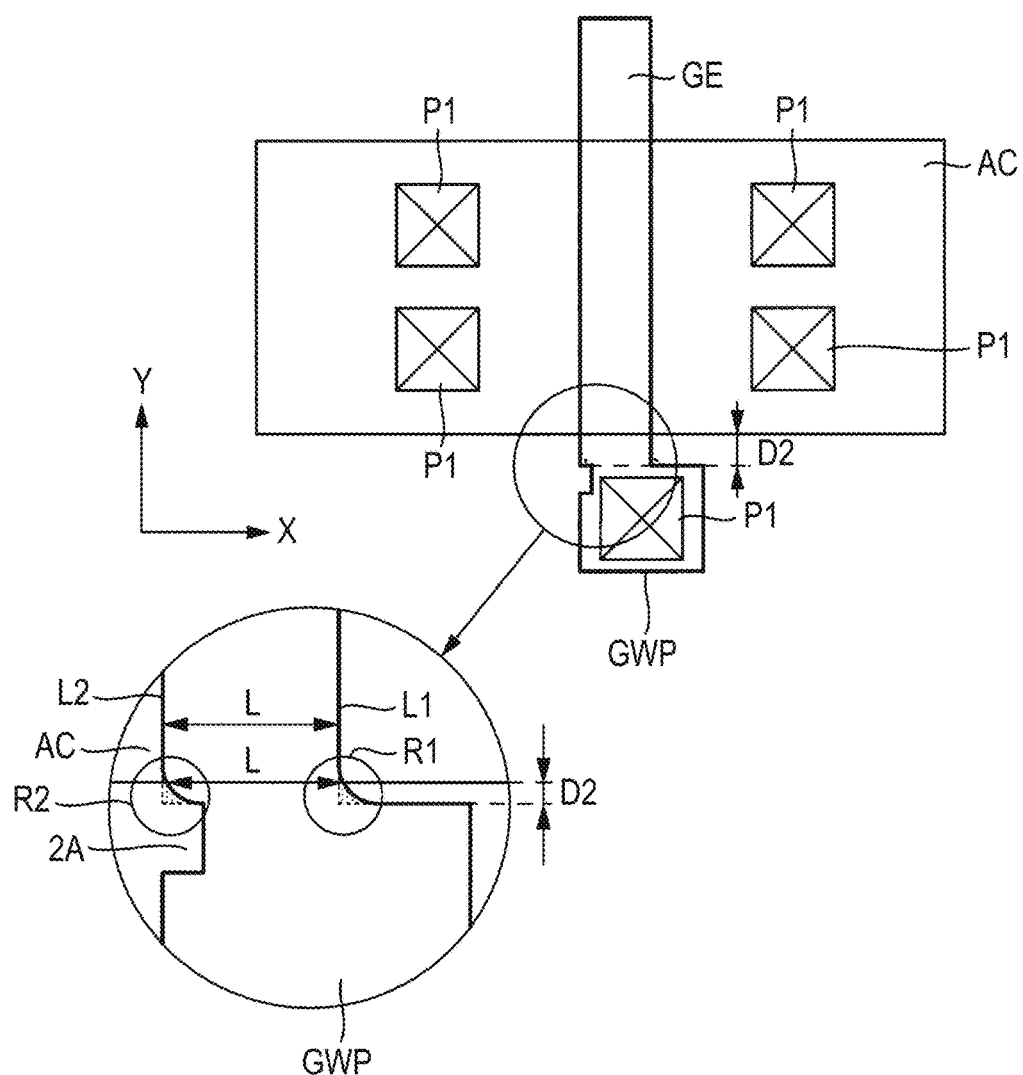
FIG. 26 is a plan view showing a structure of a semiconductor device of a fourth embodiment.

FIG. 26 is a plan view showing the structure of a semiconductor device of the fourth embodiment. In the fourth embodiment, as shown in FIG. 26, the approximately rectangular gate electrode GE with long sides extending in the Y direction is formed to traverse an approximately rectangular active region AC with long sides extending in the X direction. One end (the lower end as seen in FIG. 26) of the gate electrode GE forms a wide part GWP where a plug P1 is formed. In the active region AC, source and drain regions are formed on both sides of the gate electrode GE and plugs P1 are formed in the source and drain regions.

In the fourth embodiment, the wide part GWP of the gate electrode GE includes a projecting portion projecting from a side L1 extending in the Y direction. The wide part GWP also includes a cut-away portion 2A recessed from a side L2 extending in the Y direction. The reticle pattern (RP) used to process the gate electrode GE includes a portion corresponding to the wide part (including the projecting portion) GWP and a portion corresponding to the cut-away portion 2A.

By forming, as described above, the cut-away portion 2A on the side L2 opposing the side L1 near the projecting portion, the increase of the area of the gate electrode GE caused by formation of a rounded portion R1 where the wide part (projecting portion) GWP meets the side L1 extending in the Y direction can be made up for by the decrease of the area of the gate electrode GE caused by formation of a rounded portion R2 where the cut-away portion 2A meets the side L2 extending in the Y direction.

Hence, even when the active region AC and the wide part GWP are formed to be close to each other resulting in a small distance D2 between the active region AC and the wide part GWP, variation of the gate length L can be inhibited. This makes it possible to improve the characteristics of the MOS transistor. Also, since the distance D2 can be made small, miniaturization of the MOS transistor is facilitated.

In the semiconductor device of the fourth embodiment, the sectional shape of an active region AC portion in the vicinity of the gate electrode GE can be made the same as described with reference to, for example, FIG. 2 in connection with the first embodiment. Also, by using the above-described reticle pattern, the semiconductor device of the fourth embodiment can be formed in the same manner as for the semiconductor device of the first embodiment (see FIGS. 10 to 21).

Fifth Embodiment

Even though, the first embodiment (see FIG. 1) was described based on an example in which the semiconductor device includes an n-type MOS transistor, the semiconductor device may be one including a p-type MOS transistor. Also, the semiconductor device may include both an n-type MOS transistor and a p-type MOS transistor (CMOS (complementary metal oxide semiconductor)) transistor.

Also, the semiconductor device may include plural cells (n-type MOS transistors) with each unit cell (also referred to as a "primitive cell") making up an n-type MOS transistor like the one shown in FIG. 1 referred to in connection with the first embodiment.

Figure 27:
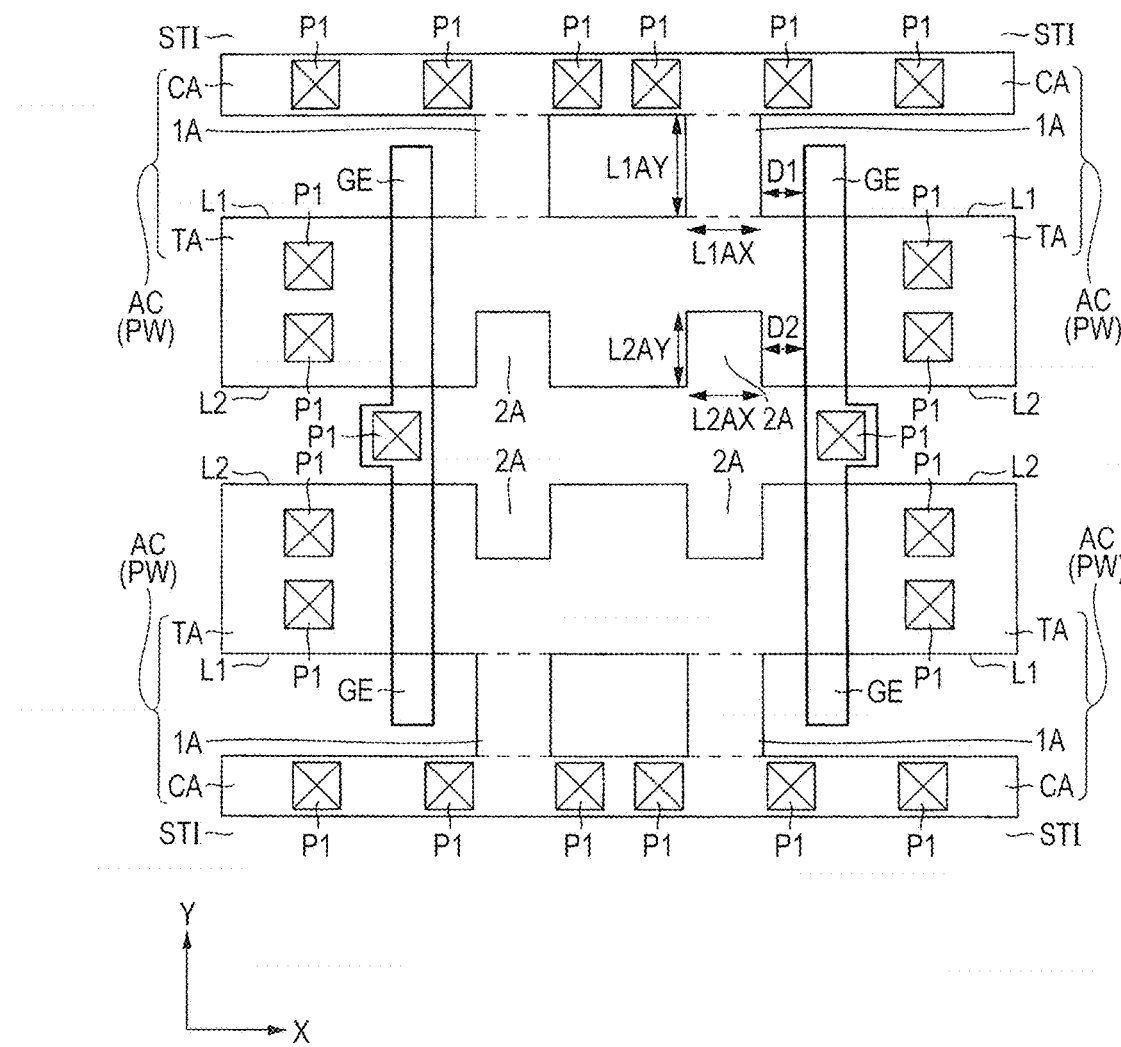
FIG. 27 is a plan view showing a structure of a semiconductor device of a fifth embodiment.

FIG. 27 is a plan view showing the structure of a semiconductor device of a fifth embodiment. According to the fifth embodiment, four (2×2) n-type MOS transistors (unit cells) each being identical to the n-type MOS transistor described in the foregoing with reference to, for example, FIG. 1. Namely, the unit cell shown in an upper right portion of FIG. 27 opposes another unit cell symmetrically with respect to the Y axis, and the two unit cells oppose other two unit cells symmetrically with respect to the X axis. The number of unit cells is not limited, that is, more than four unit cells may be included.

According to the fifth embodiment, too, forming, in each unit cell, the cut-away portion 2A on side L2 opposing side L1 where the extension part 1A is formed makes it possible to miniaturize the semiconductor device and facilitates improving the characteristics of the semiconductor device.

As in the case of the semiconductor device of the fifth embodiment including plural unit cells, unit cell miniaturization and the inhibition of variation of the unit cell characteristics generate significant advantageous effects.

Figure 28:
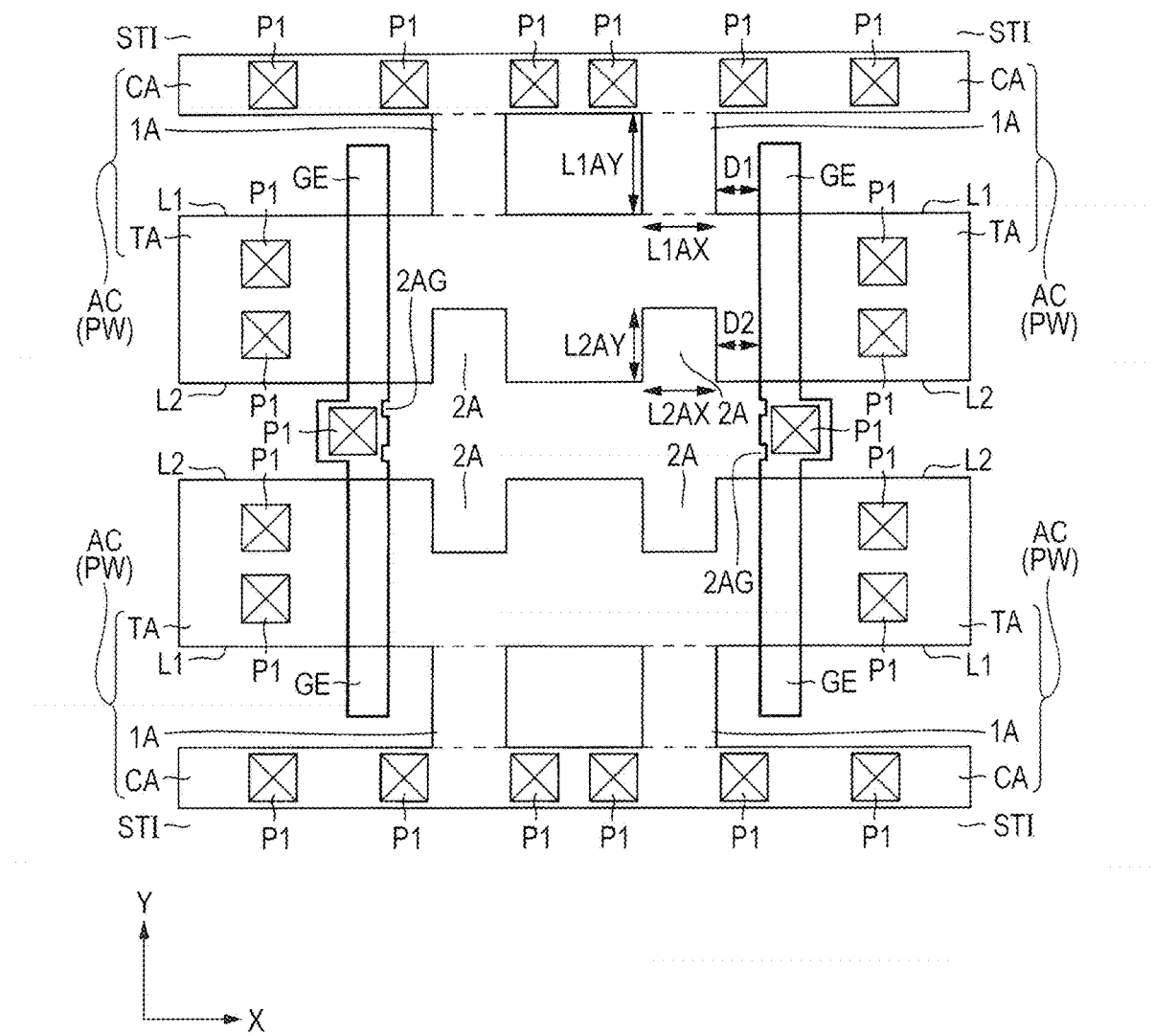
FIG. 28 is a plan view showing another structure of the semiconductor device of the fifth embodiment.

Also, as shown in FIG. 28, in addition to the cut-away portion 2A formed in the active region AC of each unit cell, a cut-away portion 2AG may also be formed in the wide part GWP of the gate electrode GE. FIG. 28 is a plan view showing another structure of the semiconductor device of the fifth embodiment. According to the semiconductor device shown in FIG. 28, in each unit cell, the pitch in each of the X direction and the Y direction can be reduced. Also, in each unit cell, variation of the gate length and gate width can be inhibited.

The invention made by the present inventors has been specifically described based on embodiments, but the invention is not limited by the above embodiments and can be modified in various ways without departing from the scope and spirit of the invention.

Figure 29A:
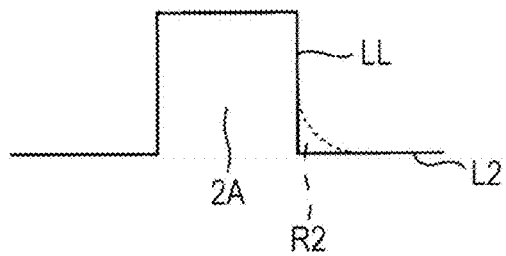
FIGS. 29A, 29B, and 29C are each a plan view showing an example shape of a cut-away portion.
Figure 29B:
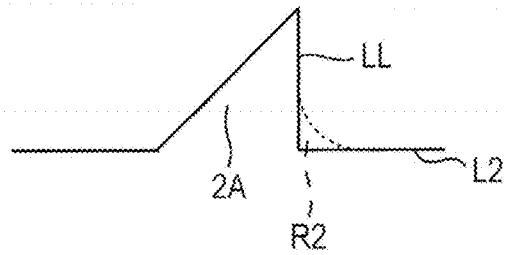
Figure 29C:
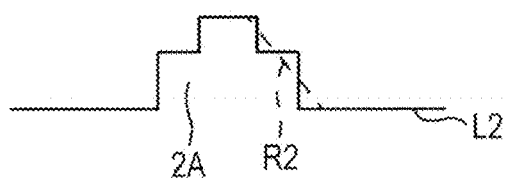

For example, as seen in a plan view of FIG. 1, the cut-away portion 2A is shown as being approximately rectangular, but the cut-away portion 2A may be triangular or convex as seen in a plan view. FIGS. 29A to 29C are plan views showing example shapes of the cut-away portion. As shown in FIG. 29A, the shape of the rounded portion R2 depends, for example, on the length of the side L2 and the length of an imaginary side LL that meets the side L2. Therefore, as long as the cut-away portion 2A includes the imaginary side LL that meets the side L2, the cut-away portion 2A may be, as seen in a plan view, triangular as shown in FIG. 29B. Or, the cut-away portion may even be polygonal having five or more sides.

Furthermore, as shown in FIG. 29C, the cut-away portion 2A may be convex as seen in a plan view.

Thus, the cut-away portion 2A may have stepped sides, as seen in a plan view, where the cut-away portion 2A meets the side L2.

Also, the edge of the rounded portion R2 need not form a truly circular arc and may form, for example, a part of an ellipse. Even though the above embodiments have been described in connection with the positional relationship between an active region and a gate electrode, the structure according to the above embodiments may be applied to other patterns which include a positional relationship similar to that between the active region and the gate electrode.

Supplement 1

A semiconductor device manufacturing method, comprising the steps of:

(a) forming an element isolation region to define an active region of a semiconductor substrate;

(b) forming, via a gate insulation film, a gate electrode over the active region extending in a first direction such that the gate electrode extends, traversing the active region, in a second direction that crosses the first direction; and (c) forming source and drain regions in the semiconductor substrate such that the source and drain regions are on both sides of the gate electrode, respectively, wherein the step of (b) comprises the steps of:

(b1) forming a masking film over a conductive film formed over the semiconductor substrate and processing the masking film using a reticle pattern; and (b2) forming the gate electrode by processing the conductive film using the masking film as a mask;

wherein the gate electrode formed in the step of (b) includes, as seen in a plan view, a first side extending in the second direction, a second side opposing the first side, a projecting part projecting from the first side, and a cut-away portion recessed from the second side.

Supplement 2

The semiconductor device manufacturing method according to Supplement 1, wherein the reticle pattern includes, as seen in a plan view, a first reticle side extending in the second direction, a second reticle side opposing the first reticle side, a reticle projecting part projecting from the first reticle side, and a reticle cut-away portion recessed from the second reticle side.

What is claimed is:

1. A semiconductor device, comprising:
   a semiconductor substrate including an active region defined by an isolating insulation region;
   a gate electrode disposed over the active region via a gate insulation film; and
   source and drain regions disposed in the semiconductor substrate to be on both sides of the gate electrode, respectively,
   wherein the gate electrode extends, traversing the active region that extends in a first direction, in a second direction that crosses the first direction, and
   wherein the active region includes, as seen in a plan view, a first side extending in the first direction, a second side opposing the first side, a projecting portion projecting from the first side, and a cut-away portion recessed from the second side.

2. The semiconductor device according to claim 1,
   wherein a region where the projecting portion and the first side is rounded, and
   wherein a region where the cut-away portion and the second side is rounded.

3. The semiconductor device according to claim 1,
   wherein the projecting portion includes a first rounded portion formed in a region where the projecting portion meets the first side, the first rounded portion having an edge projecting from the first side and rounded with a first curvature, and
   wherein the cut-away portion includes a second rounded portion formed in a region where the cut-away portion meets the second side, the second rounded portion having an edge recessed from the second side and rounded with a second curvature.

4. The semiconductor device according to claim 1,
   wherein a first distance between the projecting part and the gate electrode is equal to or smaller than two times a gate length represented by a length in the first direction of the gate electrode.

5. The semiconductor device according to claim 4,
   wherein a second distance between the cut-away portion and the gate electrode is equal to or larger than the first distance between the projecting part and the gate electrode while being equal to or smaller than a sum of the first distance and two times a length in the first direction of the projecting part.

6. The semiconductor device according to claim 4,
   wherein the second distance between the cut-away portion and the gate electrode is equal to or larger than the first distance between the projecting portion and the gate electrode while being equal to or smaller than a sum of the first distance and the length in the first direction of the projecting part.

7. The semiconductor device according to claim 1,
   wherein the cut-away portion is rectangular as seen in a plan view.

8. The semiconductor device according to claim 1,
   wherein the region where the cut-away portion and the second side is stepped as seen in a plan view.

9. A semiconductor device manufacturing method, comprising the steps of:
   (a) forming an element isolation region to define an active region of a semiconductor substrate;
   (b) forming, via a gate insulation film, a gate electrode over the active region extending in a first direction such that the gate electrode extends, traversing the active region, in a second direction that crosses the first direction; and
   (c) forming source and drain regions in the semiconductor substrate such that the source and drain regions are on both sides of the gate electrode, respectively,
   wherein the step of (a) comprises the steps of:
   (a1) forming a masking film over the semiconductor substrate and processing the masking film using a reticle pattern; and
   (a2) forming the element isolation region using the masking film as a mask,
   wherein the active region formed in the step of (a) includes, as seen in a plan view, a first side extending in the first direction, a second side opposing the first side, a projecting part projecting from the first side, and a cut-away portion recessed from the second side.

10. The semiconductor device manufacturing method according to claim 9,
    wherein the reticle pattern includes, as seen in a plan view, a first reticle side extending in the first direction, a second reticle side opposing the first reticle side, a reticle projecting part projecting from the first reticle side, and a reticle cut-away portion recessed from the second reticle side.

11. The semiconductor device manufacturing method according to claim 10,
    wherein a region where the projecting portion and the first side is rounded, and
    wherein a region where the cut-away portion and the second side is rounded.

12. The semiconductor device manufacturing method according to claim 10,
    wherein the projecting portion includes a first rounded portion formed in a region where the projecting portion meets the first side, the first rounded portion having an edge projecting from the first side and rounded with a first curvature, and
    wherein the cut-away portion includes a second rounded portion formed in a region where the cut-away portion meets the second side, the second rounded portion having an edge recessed from the second side and rounded with a second curvature.

13. The semiconductor device manufacturing method according to claim 9, wherein a first distance between the projecting part and the gate electrode is equal to or smaller than two times a gate length represented by a length in the first direction of the gate electrode.

14. The semiconductor device manufacturing method according to claim 13,
wherein a second distance between the cut-away portion and the gate electrode is equal to or larger than the first distance between the projecting part and the gate electrode while being equal to or smaller than a sum of the first distance and a length in the first direction of the projecting part.

15. The semiconductor device manufacturing method according to claim 13,
wherein the second distance between the cut-away portion and the gate electrode is equal to or larger than the first distance between the projecting portion and the gate electrode while being equal to or smaller than a sum of the first distance and two times the length in the first direction of the projecting part.

16. The semiconductor device manufacturing method according to claim 10,
wherein the reticle projecting part includes a correction pattern formed in a region where the reticle projecting part meets the first reticle side.

17. The semiconductor device manufacturing method according to claim 16,
wherein the correction pattern is an L-shaped cut-away pattern formed in a region where the reticle projecting part and the first reticle side.

18. A semiconductor device, comprising:
a semiconductor substrate including an active region defined by an isolating insulation region;
a gate electrode disposed over the active region via a gate insulation film; and
source and drain regions disposed in the semiconductor substrate to be on both sides of the gate electrode, respectively,
wherein the active region extends in the first direction as seen in a plan view, and
wherein the gate electrode extends, traversing the active region that extends in the first direction, in a second direction that crosses the first direction and includes a first side extending in the second direction, a second side opposing the first side, a projecting part projecting from the first side, and a cut-away portion recessed from the second side.

19. The semiconductor device according to claim 18,
wherein a region where the projecting portion and the first side is rounded, and
wherein a region where the cut-away portion and the second side is rounded.

20. The semiconductor device according to claim 18,
wherein the projecting portion includes a first rounded portion formed in a region where the projecting portion meets the first side, the first rounded portion having an edge projecting from the first side and rounded with a first curvature, and
wherein the cut-away portion includes a second rounded portion formed in a region where the cut-away portion meets the second side, the second rounded portion having an edge recessed from the second side and rounded with a second curvature.

* * * * *